(12) United States Patent
Moon et al.

(10) Patent No.: US 11,744,125 B2
(45) Date of Patent: Aug. 29, 2023

(54) DISPLAY DEVICE WITH ORGANIC INSULATING LAYER COVERING CONTACT BRIDGE AND ELECTROSTATIC ELECTRODE

(71) Applicant: Samsung Display Co., Ltd., Yongin-si (KR)

(72) Inventors: Sang-Ho Moon, Cheonan-si (KR); Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 275 days.

(21) Appl. No.: 17/191,919

(22) Filed: Mar. 4, 2021

(65) Prior Publication Data

US 2022/0013616 A1 Jan. 13, 2022

(30) Foreign Application Priority Data

Jul. 10, 2020 (KR) .................. 10-2020-0085366

(51) Int. Cl.
*H01L 27/02* (2006.01)
*H10K 59/131* (2023.01)
*H10K 59/126* (2023.01)

(52) U.S. Cl.
CPC ....... *H10K 59/131* (2023.02); *H01L 27/0255* (2013.01); *H10K 59/126* (2023.02)

(58) Field of Classification Search
CPC ............. H01L 27/3276; H01L 27/0255; H01L 27/3272; H10K 59/131; H10K 59/126
See application file for complete search history.

(56) References Cited

U.S. PATENT DOCUMENTS

| 11,127,642 B2* | 9/2021 | Li ..................... H01L 22/32 |
| 2009/0109134 A1* | 4/2009 | Kim .................. G02F 1/136204 345/55 |
| 2019/0391454 A1* | 12/2019 | Koide ................... G02F 1/1345 |

FOREIGN PATENT DOCUMENTS

KR 10-2047920 B1 11/2019

* cited by examiner

*Primary Examiner* — Lex H Malsawma
(74) *Attorney, Agent, or Firm* — Lewis Roca Rothgerber Christie LLP

(57) ABSTRACT

A display device includes a substrate including a display area and a non-display area, a first wiring at the non-display area of the substrate, a second wiring on a layer that is different from the first wiring at the non-display area of the substrate, an inorganic insulating layer on the first wiring and the second wiring, a pad on the inorganic insulating layer, and connected to a first end of the first wiring, a contact bridge on the inorganic insulating layer, and connecting the second wiring to a second end of the first wiring, an electrostatic electrode on the inorganic insulating layer between the pad and the contact bridge, a first organic insulating layer covering the contact bridge and the electrostatic electrode, and exposing the pad, a first upper wiring on the first organic insulating layer, and overlapping the contact bridge and the electrostatic electrode, and a second organic insulating layer on the first upper wiring.

20 Claims, 19 Drawing Sheets

DISPLAY DEVICE WITH ORGANIC INSULATING LAYER COVERING CONTACT BRIDGE AND ELECTROSTATIC ELECTRODE

CROSS-REFERENCE TO RELATED APPLICATION

This application claims priority to, and the benefit of, Korean Patent Application No. 10-2020-0085366 filed on Jul. 10, 2020 in the Korean Intellectual Property Office (KIPO), the entire contents of which are incorporated herein by reference.

BACKGROUND

1. Field

Embodiments relate to a display device for reducing or preventing the likelihood of the occurrence of damage.

2. Description of the Related Art

A display device may include a display panel, and a driving chip that provides signals, voltages, and the like to the display panel. The driving chip may be connected to the display panel through a pad formed on the display panel.

In case of misalignment when the driving chip is bonded to the pad, the driving chip may be re-bonded to the pad through a rework process. During the rework process, an organic insulating layer that exposes the pad and that covers a contact bridge may be damaged in the process of cleaning the pad bonded to the driving chip. Accordingly, external impurities may be introduced through the damaged organic insulating layer, and a wiring connected to the contact bridge may be corroded. The corrosion of the wiring may cause defects in vertical lines of the display device.

SUMMARY

Embodiments provide a display device for reducing or preventing a corrosion of a wiring.

A display device according to some embodiments includes a substrate including a display area and a non-display area, a first wiring at the non-display area of the substrate, a second wiring on a layer that is different from the first wiring at the non-display area of the substrate, an inorganic insulating layer on the first wiring and the second wiring, a pad on the inorganic insulating layer, and connected to a first end of the first wiring, a contact bridge on the inorganic insulating layer, and connecting the second wiring to a second end of the first wiring, an electrostatic electrode on the inorganic insulating layer between the pad and the contact bridge, a first organic insulating layer covering the contact bridge and the electrostatic electrode, and exposing the pad, a first upper wiring on the first organic insulating layer, and overlapping the contact bridge and the electrostatic electrode, and a second organic insulating layer on the first upper wiring.

A distance from the pad to the contact bridge may be greater than a distance from the pad to the electrostatic electrode.

The first upper wiring may include at least one of molybdenum (Mo), aluminum (Al), neodymium (Nd), nickel (Ni), lanthanum (La), titanium (Ti), copper (Cu), silver (Ag), indium tin oxide (ITO), and/or indium zinc oxide (IZO).

The first upper wiring may include a side-wall extending between the pad and the electrostatic electrode, and coming into contact with the inorganic insulating layer.

The display device may further include an active pattern on the display area of the substrate, a first gate electrode on the active pattern, a second gate electrode on the first gate electrode, a source electrode and a drain electrode connected to the active pattern, a first via insulating layer on the source electrode and the drain electrode, a pixel electrode on the first via insulating layer, and electrically connected to the drain electrode, and a pixel defining layer on a portion of the pixel electrode.

The first organic insulating layer, the first upper wiring, and the second organic insulating layer may be on the same layers as the first via insulating layer, the pixel electrode, and the pixel defining layer, respectively.

The display device may further include a second via insulating layer between the first via insulating layer and the pixel defining layer, and a connection electrode between the first via insulating layer and the second via insulating layer, and connecting the drain electrode to the pixel electrode.

The first organic insulating layer, the first upper wiring, and the second organic insulating layer may be on the same layers as the first via insulating layer, the connection electrode, and the second via insulating layer, respectively.

The first organic insulating layer, the first upper wiring, and the second organic insulating layer may be on the same layers as the first and second via insulating layers, the pixel electrode, and the pixel defining layer, respectively.

The display device may further include an electrostatic active pattern connected to the electrostatic electrode, and on a same layer as the active pattern, wherein the electrostatic active pattern, the first wiring, and the electrostatic electrode form an electrostatic diode.

The display device may further include a third organic insulating layer on the second organic insulating layer.

The display device may further include a second upper wiring between the second organic insulating layer and the third organic insulating layer, and overlapping the first upper wiring.

The second upper wiring may include at least one of molybdenum (Mo), aluminum (Al), neodymium (Nd), nickel (Ni), lanthanum (La), titanium (Ti), copper (Cu), silver (Ag), indium tin oxide (ITO), and/or indium zinc oxide (IZO).

The second upper wiring may include a side-wall extending between the pad and the electrostatic electrode, and coming into contact with the inorganic insulating layer.

The second upper wiring may be connected to the first upper wiring.

The display device may further include an active pattern on the display area of the substrate, a first gate electrode on the active pattern, a second gate electrode on the first gate electrode, a source electrode and a drain electrode connected to the active pattern, a first via insulating layer on the source electrode and the drain electrode, a connection electrode on the first via insulating layer, and connected to the drain electrode, a second via insulating layer on the connection electrode, a pixel electrode on the second via insulating layer, and connected to the connection electrode, and a pixel defining layer on a portion of the pixel electrode.

The first organic insulating layer, the first upper wiring, the second organic insulating layer, the second upper wiring, and the third organic insulating layer may be on the same layers as the first via insulating layer, the connection electrode, the second via insulating layer, the pixel electrode, and the pixel defining layer, respectively.

The display device may further include a driving chip on the pad exposed by the first organic insulating layer, and electrically connected to the pad.

A display device according to some embodiments includes a substrate, a first wiring on the substrate, a second wiring on the substrate on a layer that is different from the first wiring, an inorganic insulating layer on the first wiring and the second wiring, a pad on the inorganic insulating layer, and connected to a first end of the first wiring, a contact bridge on the inorganic insulating layer, and connecting a second end of the first wiring to the second wiring, an electrostatic electrode on the inorganic insulating layer between the pad and the contact bridge, and an organic insulating layer covering the contact bridge and the electrostatic electrode, and exposing the pad.

A distance from the pad to the contact bridge may be greater than a distance from the pad to the electrostatic electrode.

In the display device according to some embodiments, the pad, the electrostatic electrode, and the contact bridge may be located in order so that the contact bridge may be away from the end portion of the organic insulating layer, and so that the upper wiring overlapping the contact bridge and the electrostatic electrode may be located on the organic insulating layer. Therefore, the contact bridge may be protected from external impurities. Accordingly, the wiring connected to the contact bridge may not be corroded.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
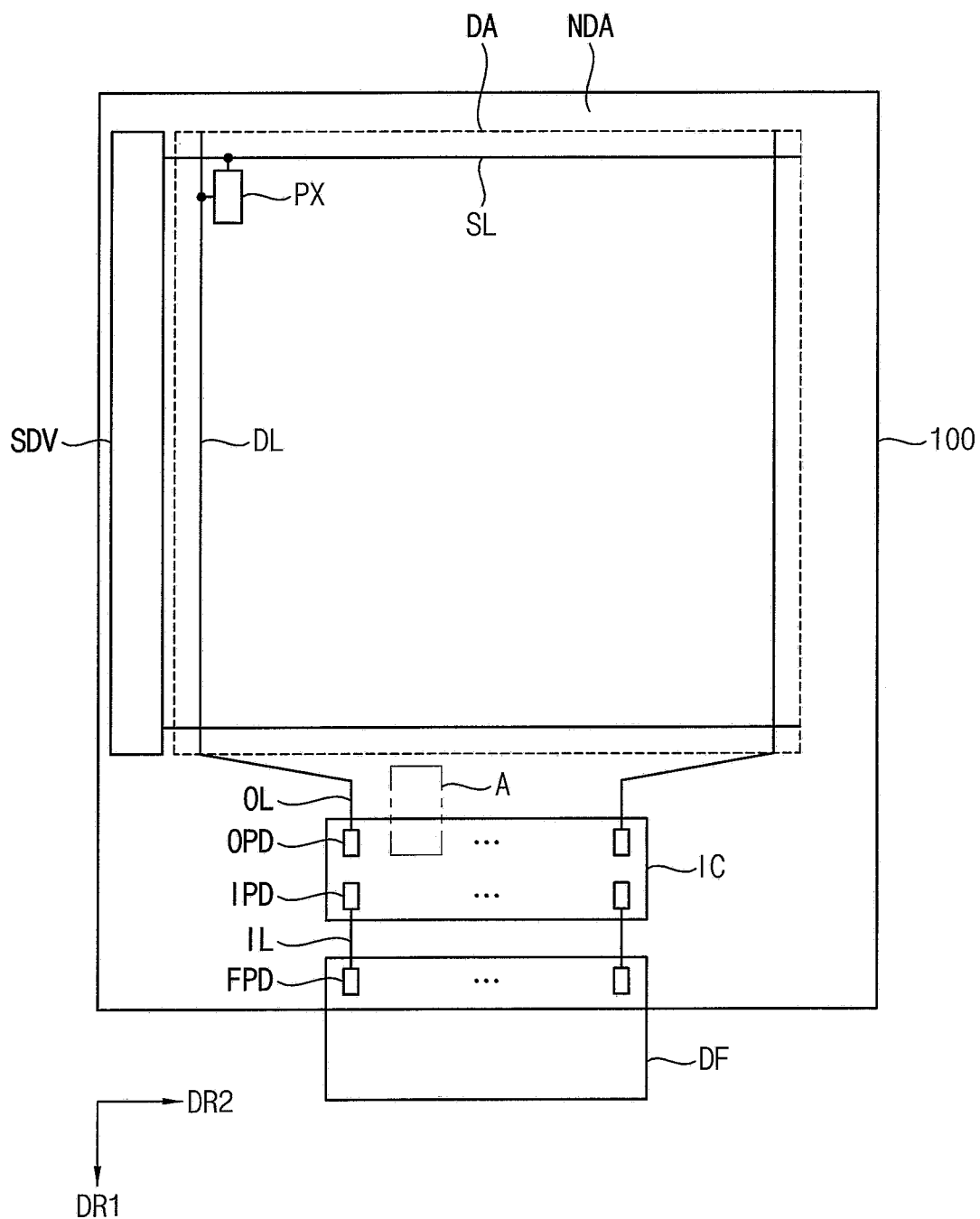
FIG. 1 is a plan view showing a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, display devices according to embodiments will be described with reference to FIGS. 1 to 5.

FIG. 1 is a plan view showing a display device according to some embodiments of the present disclosure.

Referring to FIG. 1, the display device according to some embodiments of the present disclosure may include a substrate 100, pixels PX located on the substrate 100, a scan driver SDV, a driving chip IC, and a driving film DF.

The substrate 100 may include a display area DA and a non-display area NDA. The non-display area NDA may be adjacent to the display area DA. In some embodiments, the non-display area NDA may surround a periphery of the display area DA.

The pixels PX may be located on the display area DA of the substrate 100.

The pixels PX may be arranged in the display area DA along a first direction DR1, and along a second direction DR2 crossing the first direction DR1. Each of the pixels PX may be connected to a corresponding scan line SL and a corresponding data line DL to receive a scan signal and a data signal. Each of the pixels PX may emit light based on the scan signal and the data signal, and the display area DA may display an image formed by the emitted light.

The scan driver SDV may be located on the non-display area NDA of the substrate 100. The scan driver SDV may be located in the second direction DR2 from the display area DA. The scan driver SDV may provide the scan signal to the scan line SL.

Output pads OPD, input pads IPD, film pads FPD, output wirings OL, and input wirings IL may be located on the non-display area NDA of the substrate 100. The output pads OPD, the input pads IPD, the film pads FPD, the output wirings OL, and the input wirings IL may be located in the first direction DR1 from the display area DA.

The input pads IPD may be located in the first direction DR1 from the output pads OPD, and the film pads FPD may be located in the first direction DR1 from the input pads IPD. The output wiring OL may connect the input pad IPD to the data line DL, and the input wiring IL may connect the input pad IPD to the film pad FPD.

The driving chip IC may be located on the non-display area NDA of the substrate 100. The driving chip IC may be located on the input pads IPD and on the output pads OPD. In some embodiments, the driving chip IC may be mounted on the input pads IPD and the output pads OPD in a chip-on-glass (COG) manner or in a chip-on-plastic (COP) manner. The driving chip IC may include input bumps and output bumps, and the input bumps and the output bumps may be electrically connected to the input pads IPD and the output pads OPD.

The driving chip IC may include a data driver. The data driver may provide the data signal to the data line DL through the output line OL.

The driving film may be located on the non-display area NDA of the substrate 100. The driving film may be located on the film pads FPD. In some embodiments, the driving film may be mounted on the film pads FPD in a film-on-glass (FOG) manner or in a film-on-plastic (FOP) manner. The driving film may include bumps, and the bumps may be electrically connected to the film pads FPD, respectively.

Figure 2:
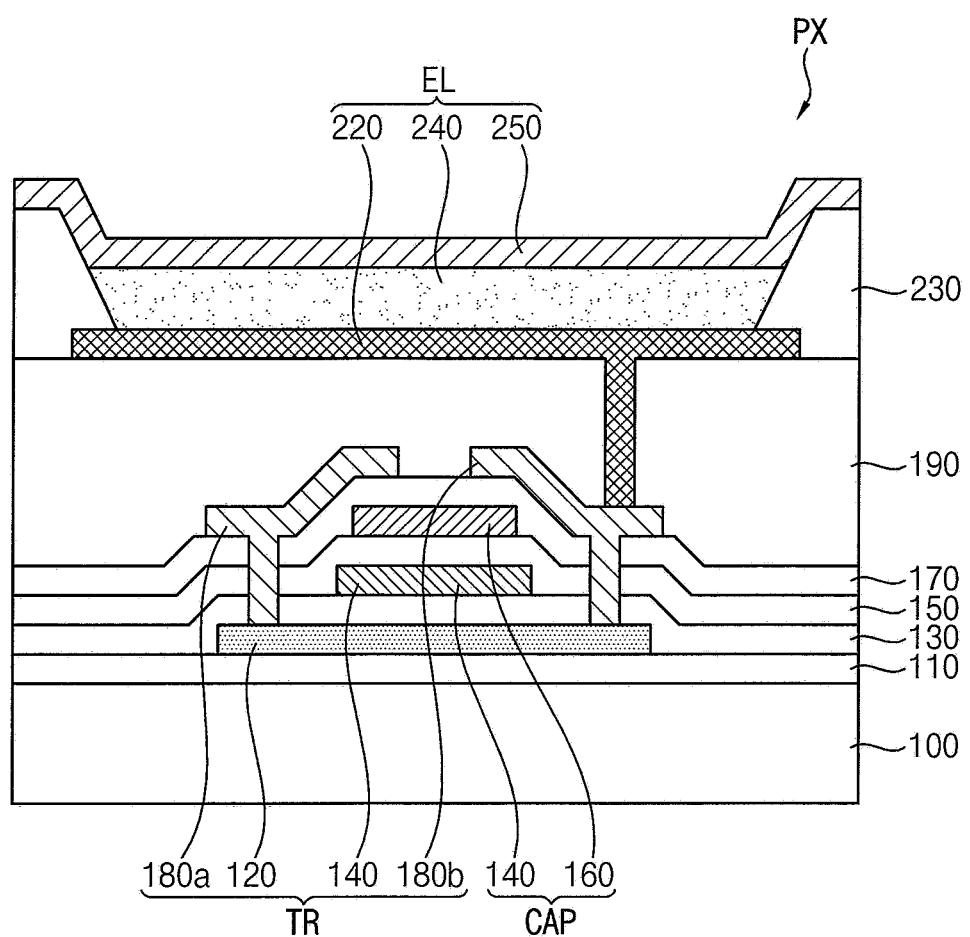
FIG. 2 is a sectional view showing a display area of the display device of FIG. 1.

FIG. 2 is a sectional view showing the display area DA of the display device of FIG. 1. For example, FIG. 2 may show one example of the pixel PX of FIG. 1.

Referring to FIG. 2, the display device may include a buffer layer 110, an active pattern 120, a first gate insulating layer 130, a first gate electrode 140, a second gate insulating layer 150, a second gate electrode 160, an interlayer insulating layer 170, a source electrode 180a, a drain electrode 180b, a first via insulating layer 190, a pixel electrode 220, a pixel defining layer 230, a light emitting layer 240, and a counter electrode 250 that are located in the display area DA on the substrate 100.

The substrate 100 may be a transparent insulating substrate. For example, the substrate 100 may be formed of glass, quartz, plastic, or the like.

The buffer layer 110 may be located on the substrate 100. The buffer layer 110 may block an inflow of impurities into the active pattern 120 from the outside through the substrate 100. The buffer layer 110 may be an inorganic insulating layer including an inorganic insulating material such as silicon nitride, silicon oxide, and silicon oxynitride.

The active pattern 120 may be located on the buffer layer 110. The active pattern 120 may include amorphous silicon, polycrystalline silicon, an oxide semiconductor, and the like. The active pattern 120 may include a source area, a drain area, and a channel area located between the source area and the drain area. The source area and the drain area may be doped with P-type or N-type impurities, and the channel area might not be doped with impurities, or may be doped with impurities having a type that is different from the types of the source area and/or the drain area.

The first gate insulating layer 130 may be located on the active pattern 120. The first gate insulating layer 130 may be located on the buffer layer 110 while covering the active pattern 120. In some embodiments, the first gate insulating layer 130 may be formed along profiles of the buffer layer 110 and the active pattern 120. The first gate insulating layer 130 may be an inorganic insulating layer including an inorganic insulating material, such as silicon nitride, silicon oxide, and silicon oxynitride.

The first gate electrode 140 may be located on the first gate insulating layer 130. The first gate electrode 140 may overlap the channel area of the active pattern 120. The first gate electrode 140 may include a conductive material such as molybdenum (Mo), copper (Cu), aluminum (Al), and titanium (Ti).

The second gate insulating layer 150 may be located on the first gate electrode 140. The second gate insulating layer 150 may be located on the first gate insulating layer 130 while covering the first gate electrode 140. In some embodiments, the second gate insulating layer 150 may be formed along profiles of the first gate insulating layer 130 and the first gate electrode 140. The second gate insulating layer 150 may be an inorganic insulating layer including an inorganic insulating material such as silicon nitride, silicon oxide, and silicon oxynitride.

The second gate electrode 160 may be located on the second gate insulating layer 150. The second gate electrode 160 may overlap the first gate electrode 140.

The second gate electrode 160 may include a conductive material such as molybdenum (Mo), copper (Cu), aluminum (Al), and titanium (Ti). The first gate electrode 140 and the second gate electrode 160 may form a capacitor CAP.

The interlayer insulating layer 170 may be located on the second gate electrode 160. The interlayer insulating layer 170 may be located on the second gate insulating layer 150 while covering the second gate electrode 160. In some embodiments, the interlayer insulating layer 170 may be formed along profiles of the second gate insulating layer 150 and the second gate electrode 160. The interlayer insulating layer 170 may be an inorganic insulating layer including an inorganic insulating material, such as silicon nitride, silicon oxide, and silicon oxynitride.

The source electrode 180a and the drain electrode 180b may be located on the interlayer insulating layer 170. The source electrode 180a and the drain electrode 180b may be connected to the source area and the drain area of the active pattern 120, respectively. The source electrode 180a and the drain electrode 180b may include a conductive material such as molybdenum (Mo), aluminum (Al), neodymium (Nd), nickel (Ni), lanthanum (La), titanium (Ti), copper (Cu), silver (Ag), indium tin oxide (ITO), and indium zinc oxide (IZO). The active pattern 120, the first gate electrode 140, the source electrode 180a, and the drain electrode 180b may form a transistor TR.

The via insulating layer 190 may be located on the source electrode 180a and the drain electrode 180b. The via insulating layer 190 may be located on the interlayer insulating layer 170 while covering the source electrode 180a and the drain electrode 180b. In some embodiments, the via insulating layer 190 may have a flat top surface.

The via insulating layer 190 may be an organic insulating layer including an organic insulating material such as polyimide (PI).

The pixel electrode 220 may be located on the first via insulating layer 190. The pixel electrode 220 may be connected to the drain electrode 180b. The pixel electrode 220 may include a conductive material such as molybdenum (Mo), aluminum (Al), neodymium (Nd), nickel (Ni), lanthanum (La), titanium (Ti), copper (Cu), silver (Ag), indium tin oxide (ITO), and indium zinc oxide (IZO).

The pixel defining layer 230 may be located on the pixel electrode 220. The pixel defining layer 230 may be located on the first via insulating layer 190 while covering the pixel electrode 220. The pixel defining layer 230 may have a pixel opening that exposes at least a part of the pixel electrode 220. The pixel opening may expose a central portion of the pixel electrode 220, and the pixel defining layer 230 may cover a peripheral portion of the pixel electrode 220. In some embodiments, the pixel defining layer 230 may have a flat top surface. The pixel defining layer 230 may be an organic insulating layer including an organic insulating material, such as polyimide (PI).

The light emitting layer 240 may be located on the pixel electrode 220. The light emitting layer 240 may be located on the pixel electrode 220 exposed by the pixel opening. The light emitting layer 240 may include at least one of an organic light emitting material and a quantum dot.

In some embodiments, the organic light emitting material may include a low molecular organic compound or a high molecular organic compound. For example, the low molecular organic compound may include copper phthalocyanine, N,N'-diphenylbenzidine, tris-(8-hydroxyquinoline)aluminum, and the like, and the high molecular organic compound may $^{include}$ poly(3,4-ethylenedioxythiophene, polyaniline, poly-phenylenevinylene, polyfluorene, and the like.

In some embodiments, the quantum dot may include a core including a group II-VI compound, a group III-V compound, a group IV-VI compound, a group IV element, a group IV compound, and a combination thereof. In some embodiments, the quantum dot may have a core-shell structure including a core and a shell surrounding the core. The shell may reduce or prevent the likelihood of chemical denaturation of the core, thereby serving as a protective layer for maintaining semiconductor properties and serving as a charging layer for imparting electrophoretic properties to the quantum dot.

The counter electrode 250 may be located on the light emitting layer 240. In some embodiments, the counter electrode 250 may also be located on the pixel defining layer 230. The counter electrode 250 may include a conductive material such as metal, alloy, or transparent conductive oxide. For example, the conductive material may include aluminum (Al), platinum (Pt), silver (Ag), magnesium (Mg), gold (Au), chromium (Cr), tungsten (W), titanium (Ti), and the like. The pixel electrode 220, the light emitting layer 240, and the counter electrode 250 may form a light emitting element EL.

Figure 3:
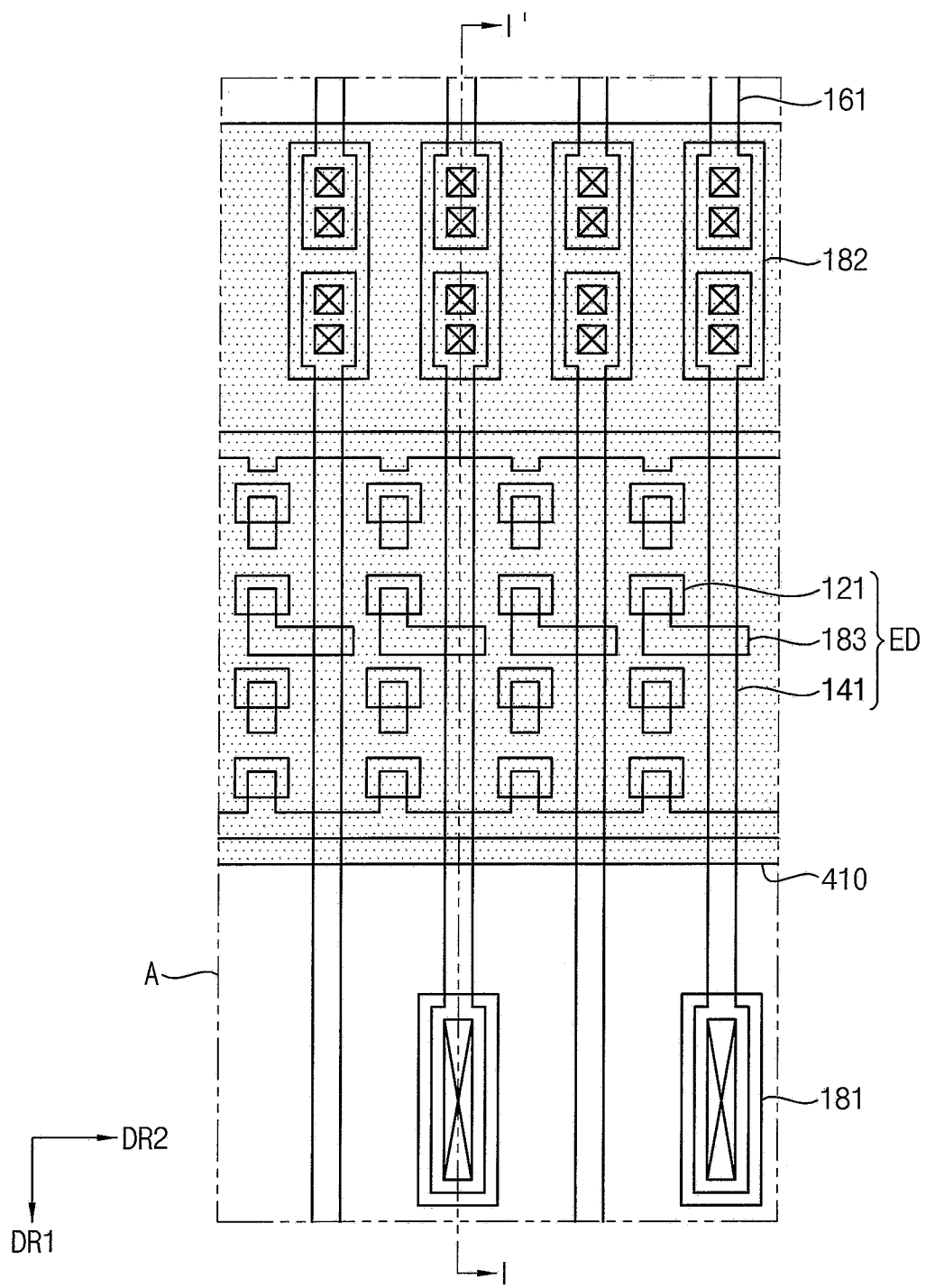
FIG. 3 is a plan view showing a non-display area of the display device of FIG. 1.
Figure 4:
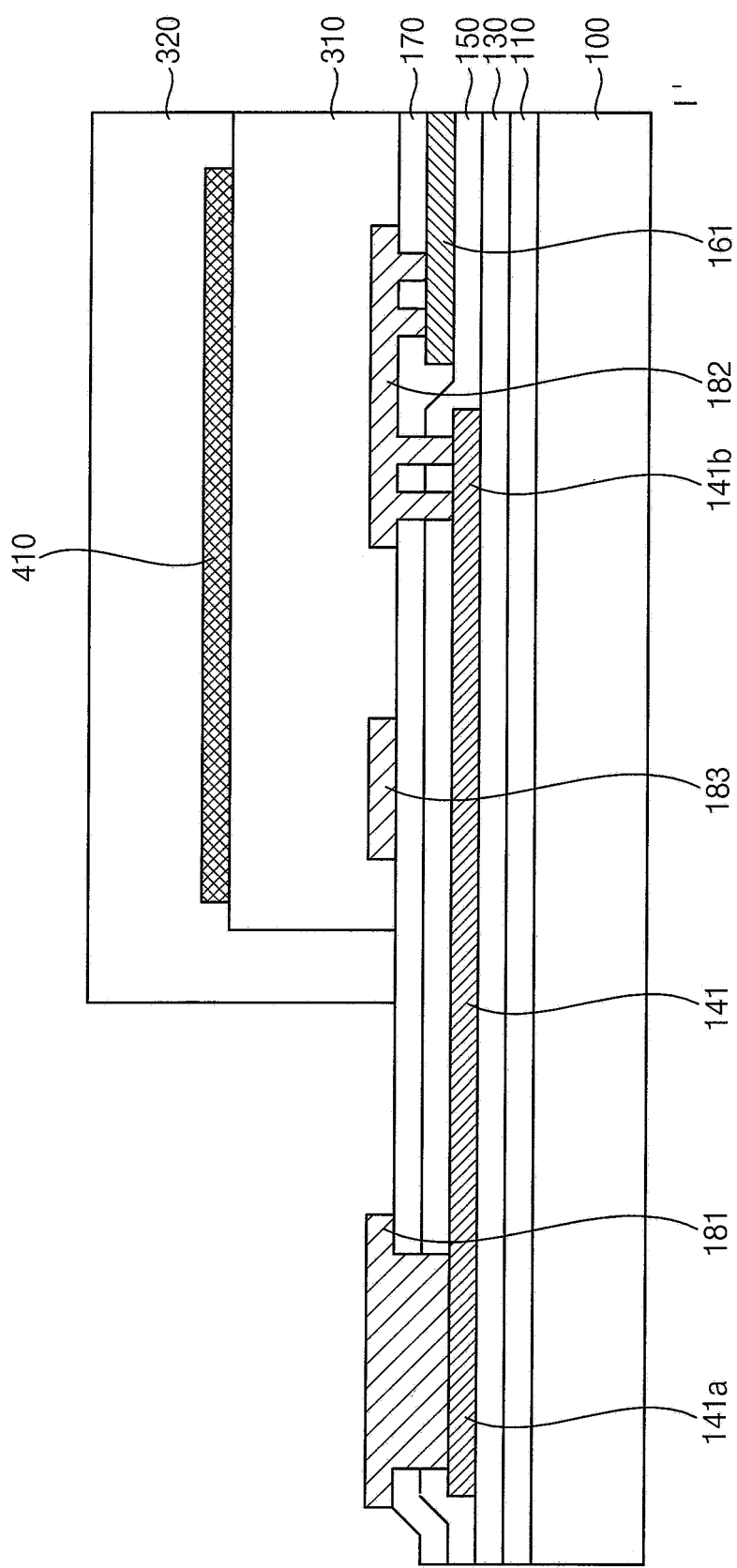
FIG. 4 is a sectional view taken along the line I-I' of FIG. 3.

FIG. 3 is a plan view showing the non-display area NDA of the display device of FIG. 1. For example, FIG. 3 may show one example of an area A of FIG. 1. FIG. 4 is a sectional view taken along the line I-I' of FIG. 3.

Referring to FIGS. 3 and 4, the display device may include a buffer layer 110, an electrostatic active pattern 121, a first gate insulating layer 130, a first wiring 141, a second gate insulating layer 150, a second wiring 161, an interlayer insulating layer 170, a pad 181, a contact bridge 182, an electrostatic electrode 183, a first organic insulating layer 310, a first upper wiring 410, and a second organic insulating layer 320 that are located in the non-display area NDA on the substrate 100.

The buffer layer 110 may be located on the substrate 100. The buffer layer 110 may extend from the display area DA to the non-display area NDA.

The electrostatic active pattern 121 may be located on the buffer layer 110. The electrostatic active pattern 121 may include substantially the same material as the active pattern 120, and may be located on the same layer as the active pattern 120.

The first gate insulating layer 130 may be located on the electrostatic active pattern 121. The first gate insulating layer 130 may be located on the buffer layer 110 while covering the electrostatic active pattern 121. The first gate insulating layer 130 may extend from the display area DA to the non-display area NDA.

The first wiring 141 may be located on the first gate insulating layer 130. The first wiring 141 may extend in the first direction D1. The first wiring 141 may include substantially the same material as the first gate electrode 140, and may be located on the same layer as the first gate electrode 140.

The second gate insulating layer 150 may be located on the first wiring 141. The second gate insulating layer 150 may be located on the first gate insulating layer 130 while covering the first wiring 141. The second gate insulating layer 150 may extend from the display area DA to the non-display area NDA.

The second wiring 161 may be located on a layer that is different from the first wiring 141. The second wiring 161 may be located on the second gate insulating layer 150. The second wiring 161 may extend in the first direction D1. The second wiring 161 may include substantially the same material as the second gate electrode 160, and may be located on the same layer as the second gate electrode 160.

The interlayer insulating layer 170 may be located on the second wiring 161. The interlayer insulating layer 170 may be located on the second gate insulating layer 150 while covering the second wiring 161. The interlayer insulating layer 170 may extend from the display area DA to the non-display area NDA.

The pad 181 may be located on the interlayer insulating layer 170. The pad 181 may be connected to a first end 141a of the first wiring 141. The pad 181 may come into contact with the first end 141a of the first wiring 141 through a first contact hole formed in the second gate insulating layer 150 and in the interlayer insulating layer 170 In some embodiments, the pad 181 may be the output pad OPD of FIG. 1.

The contact bridge 182 may be located on the interlayer insulating layer 170. The contact bridge 182 may connect the second wiring 161 to a second end 141b of the firs wiring 141, which is opposite to the first end 141a of the first wiring 141. The contact bridge 182 may come into contact with the second end 141b of the first wiring 141 through at least one second contact hole formed in the second gate insulating layer 150 and the interlayer insulating layer 170, and may come into contact with the second wiring 161 through at least one third contact hole formed in the interlayer insulating layer 170. In some embodiments, the first wiring 141, the second wiring 161, and the contact bridge 182 may form the output wiring OL of FIG. 1.

The electrostatic electrode 183 may be located on the interlayer insulating layer 170. The electrostatic electrode 183 may be located between the pad 181 and the contact bridge 182. Accordingly, when viewed in a plan view, a distance from the pad 181 to the contact bridge 182 may be greater than a distance from the pad 181 to the electrostatic electrode 183. In other words, the electrostatic electrode 183 may be positioned in the first direction DR1 from the contact bridge 182, and the pad 181 may be positioned in the first direction DR1 from the electrostatic electrode 183.

A first portion of the electrostatic electrode 183 may be connected to the electrostatic active pattern 121, and a second portion of the electrostatic electrode 183 may overlap the first wiring 141. In some embodiments, the electrostatic active pattern 121, the first wiring 141, and the electrostatic electrode 183 may form an electrostatic diode ED. The electrostatic diode ED may function to radiate static electricity transmitted through the output wiring OL.

The pad 181, the contact bridge 182, the electrostatic electrode 183 may include a conductive material such as molybdenum (Mo), aluminum (Al), neodymium (Nd), nickel (Ni), lanthanum (La), titanium (Ti), copper (Cu), silver (Ag), indium tin oxide (ITO), and indium zinc oxide (IZO). The pad 181, the contact bridge 182, and the electrostatic electrode 183 may include substantially the same material as the source electrode 180a and the drain electrode 180b, and may be located on the same layer as the source electrode 180a and the drain electrode 180b.

The first organic insulating layer 310 may be located on the contact bridge 182 and the electrostatic electrode 183. The first organic insulating layer 310 may be located on the interlayer insulating layer 170 while covering the contact bridge 182 and the electrostatic electrode 183. The first organic insulating layer 310 may expose the pad 181. The first organic insulating layer 310 may include substantially the same material as the first via insulating layer 190, and may be located on the same layer as the first via insulating layer 190. The first organic insulating layer 310 may be physically separated from the first via insulating layer 190. In other words, the first via insulating layer 190 located in the display area DA, and the first organic insulating layer 310 located in the non-display area NDA, might not be connected to each other.

The first upper wiring 410 may be located on the first organic insulating layer 310. The first upper wiring 410 may overlap the contact bridge 182 and the electrostatic electrode 183. The first upper wiring 410 may include a conductive material such as molybdenum (Mo), aluminum (Al), neodymium (Nd), nickel (Ni), lanthanum (La), titanium (Ti), copper (Cu), silver (Ag), indium tin oxide (ITO), and indium zinc oxide (IZO). The first upper wiring 410 may include substantially the same material as the pixel electrode 220, and may be located on the same layer as the pixel electrode 220.

The second organic insulating layer 320 may be located on the first upper wiring 410. The second organic insulating layer 320 may be located on the first organic insulating layer 310 while covering the first upper wiring 410. The second organic insulating layer 320 may include substantially the same material as the pixel defining layer 230, and may be located on the same layer as the pixel defining layer 230. The second organic insulating layer 320 may be physically separated from the pixel defining layer 230. In other words, the pixel defining layer 230 located in the display area DA, and the second organic insulating layer 320 located in the non-display area NDA, might not be connected to each other.

In the display device according to the embodiments, because the contact bridge 182 is positioned relatively far from the end of the first organic insulating layer 310 and the end of the second organic insulating layer 320, which are positioned between the pad 181 and the electrostatic electrode 183, the contact bridge 182 may be prevented from being damaged by impurities introduced through a damaged first and/or second organic insulating layers 310 and 320, even when the end of the first organic insulating layer 310 and/or the end of the second organic insulating layer 320 are damaged.

In addition, the first upper wiring 410 overlapping the contact bridge 182 is located over the contact bridge 182, so that the contact bridge 182 may be prevented from being damaged by the impurities introduced through a damaged second organic insulating layer 320. Accordingly, corrosion of the first and second wirings 141 and 161 connected to the contact bridge 182 may be reduced or prevented.

Figure 5:
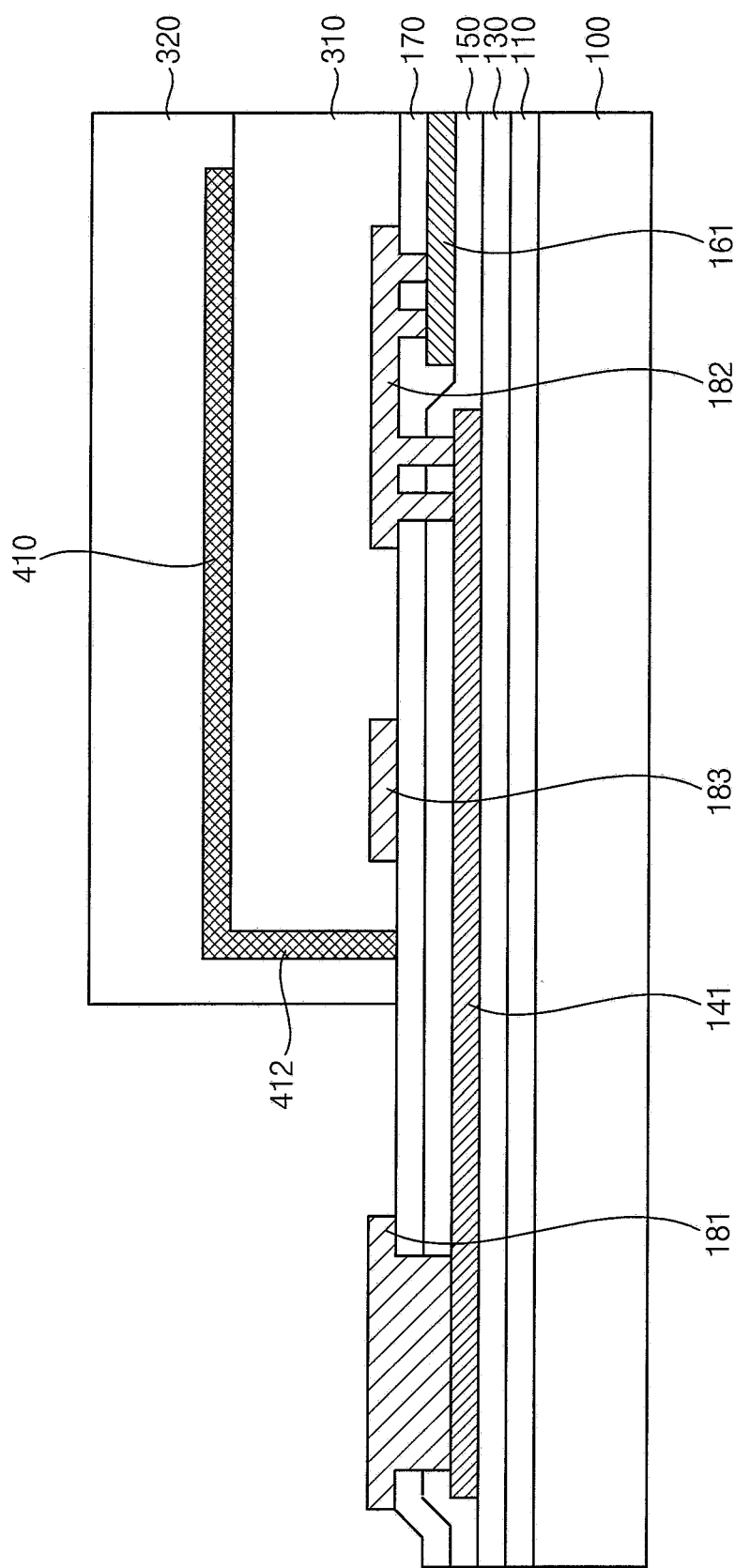
FIG. 5 is a sectional view showing a non-display area of the display device according to some embodiments of the present disclosure.

FIG. 5 is a sectional view showing the non-display area of the display device according to some embodiments of the present disclosure.

The display device described with reference to FIG. 5 may be the same as, or similar to, the display device described with reference to FIGS. 3 and 4, except for the first upper wiring 410. Accordingly, repeated descriptions for the substantially same or similar configurations will be omitted.

Referring to FIG. 5, in some embodiments, the first upper wiring 410 may include a side-wall 412 extending between the pad 181 and the electrostatic electrode 183, and coming into contact with the interlayer insulating layer 170. The side-wall 412 may be interposed between a side portion of the first organic insulating layer 310 and a side portion of the second organic insulating layer 320 to separate them from each other. When the first upper wiring 410 includes the side-wall 412 extending between the pad 181 and the electrostatic electrode 183, influence on the first organic insulating layer 310 otherwise caused by damage to the second organic insulating layer 320 may be reduced or prevented, even when the second organic insulating layer 320 is damaged in the process of manufacturing the display device.

Hereinafter, a display device according to other embodiments will be described with reference to FIGS. 6 to 19.

Figure 6:
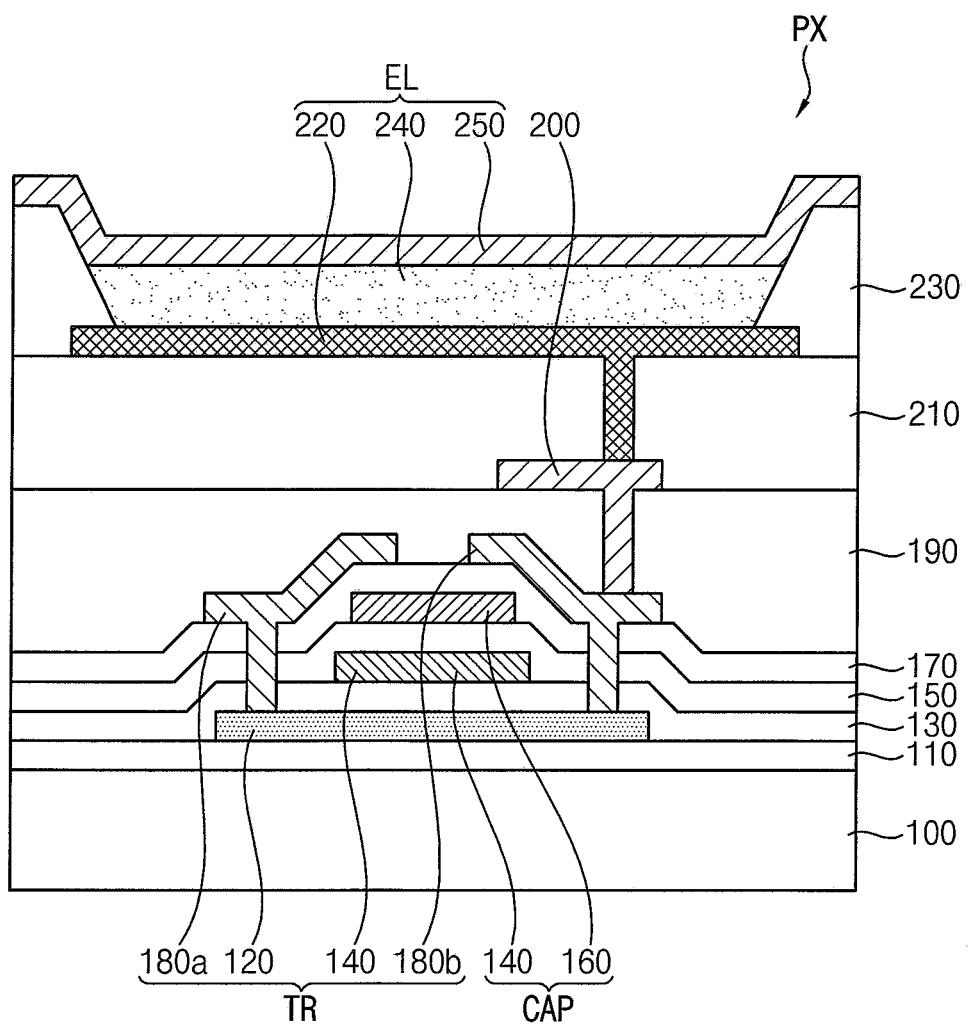
FIG. 6 is a sectional view showing a display area of the display device according to some embodiments of the present disclosure.

FIG. 6 is a sectional view showing the display area of the display device according to some embodiments of the present disclosure. For example, FIG. 6 may show another example of the pixel PX of FIG. 1.

The display device described with reference to FIG. 6 may be the same as, or similar to, the display device described with reference to FIG. 2, except for adding a connection electrode 200 and a second via insulating layer 210. Accordingly, repeated descriptions for the substantially same or similar configurations will be omitted.

Referring to FIG. 6, the display device according to some embodiments may include a buffer layer 110, an active pattern 120, a first gate insulating layer 130, a first gate electrode 140, a second gate insulating layer 150, a second gate electrode 160, an interlayer insulating layer 170, a source electrode 180a, a drain electrode 180b, a first via insulating layer 190, a connection electrode 200, a second via insulating layer 210, a pixel electrode 220, a pixel defining layer 230, a light emitting layer 240, and a counter electrode 250 that are located in the display area DA on the substrate 100.

The second via insulating layer 210 may be located between the first via insulating layer 190 and the pixel defining layer 230. In some embodiments, the second via insulating layer 210 may have a flat top surface. The second via insulating layer 210 may be an organic insulating layer including an organic insulating material such as polyimide (PI).

The connection electrode 200 may be located between the first via insulating layer 190 and the second via insulating layer 210. The connection electrode 200 may connect the drain electrode 180b to the pixel electrode 220. The connection electrode 200 may include a conductive material, such as molybdenum (Mo), aluminum (Al), eodymium (Nd), nickel (Ni), lanthanum (La), titanium (Ti), copper (Cu), silver (Ag), indium tin oxide (ITO), and indium zinc oxide (IZO).

Figure 7:
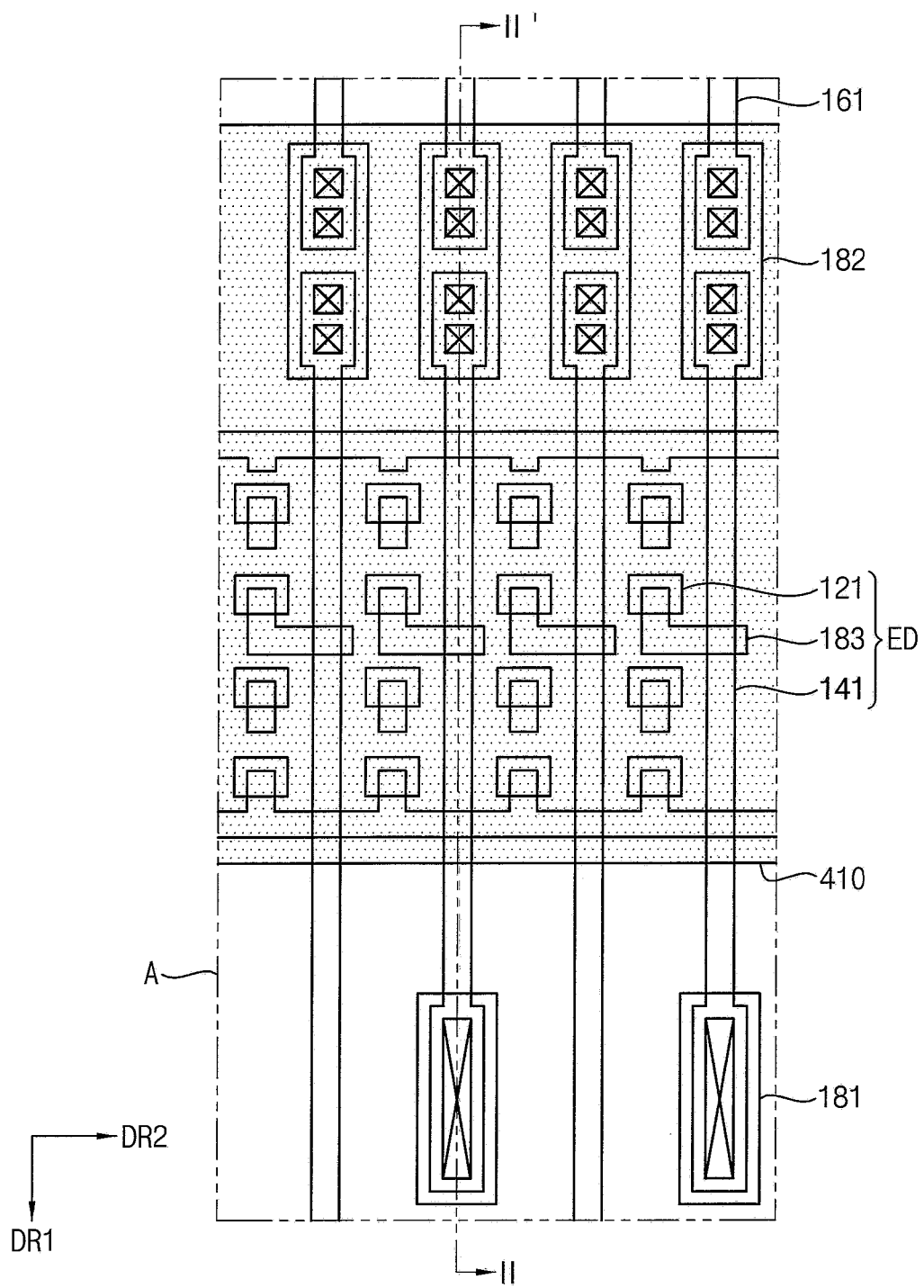
FIG. 7 is a plan view showing a non-display area of the display device according to some embodiments of the present disclosure.
Figure 8:
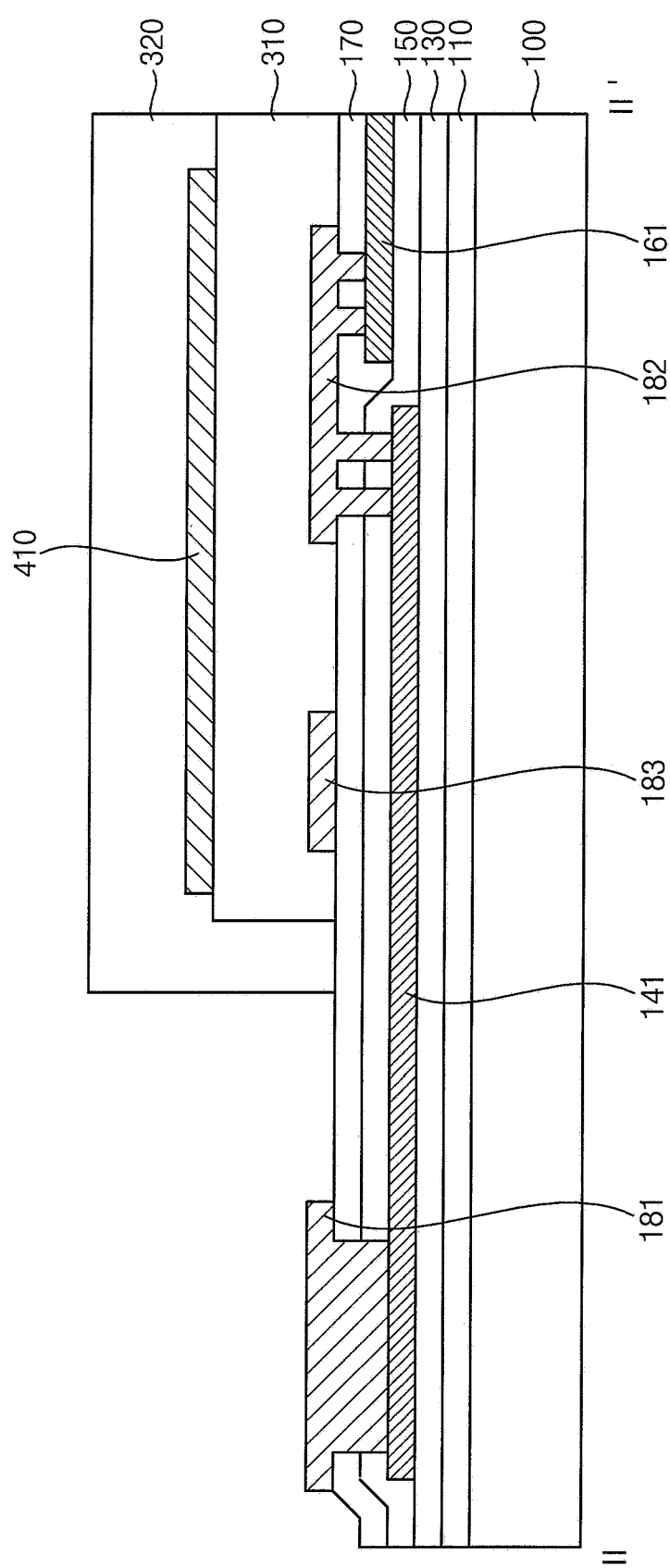
FIG. 8 is a sectional view taken along the line II-II' of FIG. 7.

FIG. 7 is a plan view showing the non-display area of the display device according to some embodiments of the present disclosure. For example, FIG. 7 may show another example of the area A of FIG. 1. FIG. 8 is a sectional view taken along the line II-II' of FIG. 7.

The display device described with reference to FIGS. 7 and 8 may be the same as, or similar to, the display device described with reference to FIGS. 3 and 4, except for the first upper wiring 410 and the second organic insulating layer 320. Accordingly, repeated descriptions for the substantially same or similar configurations will be omitted.

Referring to FIGS. 7 and 8, the first upper wiring 410 may be located on the first organic insulating layer 310. The first upper wiring 410 may overlap the contact bridge 182 and the electrostatic electrode 183. The first upper wiring 410 may include substantially the same material as the connection electrode 200, and may be located on the same layer as the connection electrode 200.

The second organic insulating layer 320 may be located on the first upper wiring 410. The second organic insulating layer 320 may be located on the first organic insulating layer 310 while covering the first upper wiring 410. The second organic insulating layer 320 may include substantially the same material as the second via insulating layer 210, and may be located on the same layer as the second via insulating layer 210. The second organic insulating layer 320 may be physically separated from the second via insulating layer 210. In other words, the second via insulating layer 210 located in the display area DA, and the second organic insulating layer 320 located in the non-display area NDA, might not be connected to each other.

Figure 9:
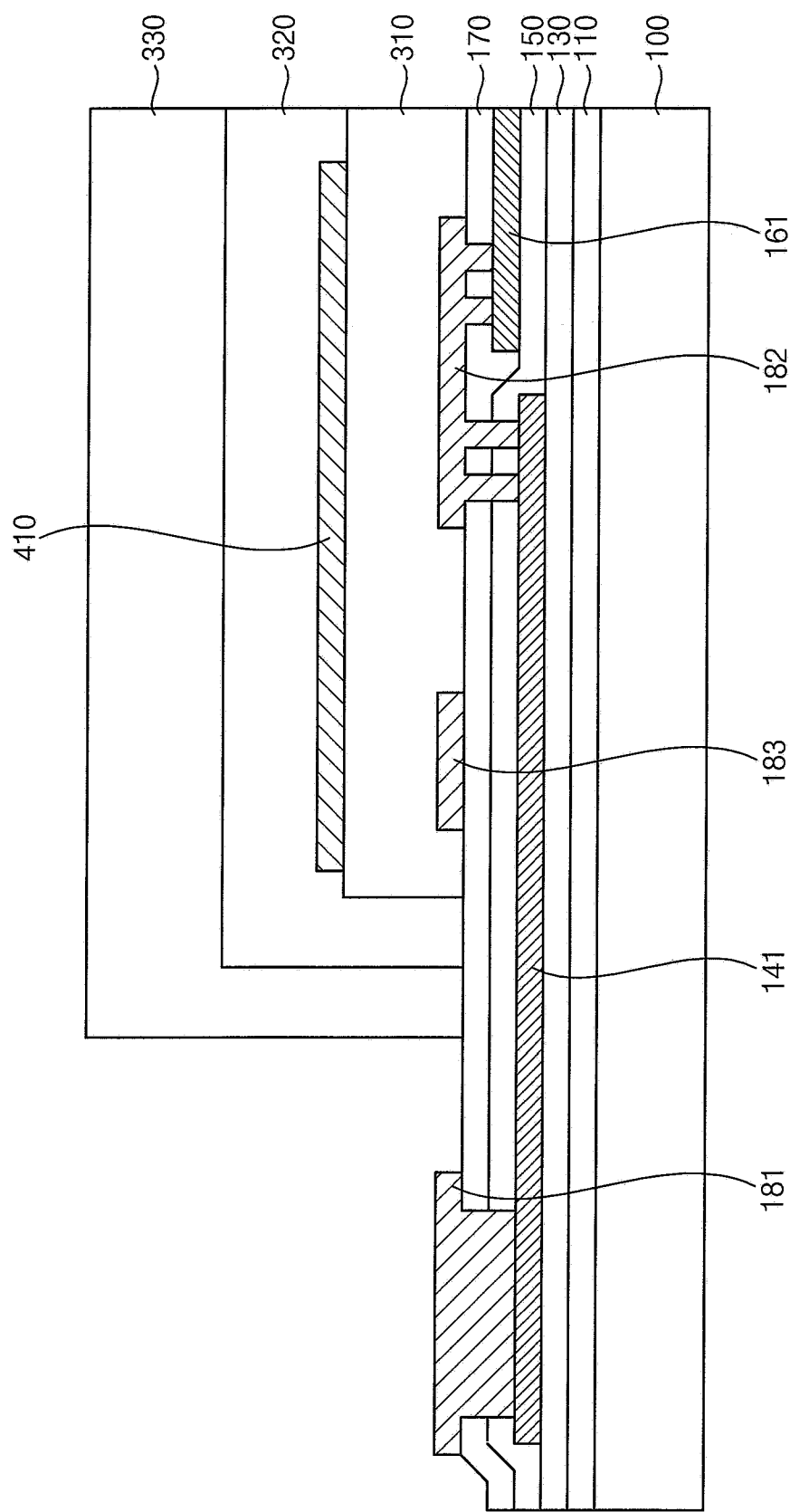
FIG. 9 is a sectional view showing a non-display area of the display device according to some embodiments of the present disclosure.

FIG. 9 is a sectional view showing the non-display area of the display device according to some embodiments of the present disclosure.

The display device described with reference to FIG. 9 may be the same as, or similar to, the display device described with reference to FIGS. 7 and 8, except for a third organic insulating layer 330. Accordingly, repeated descriptions for the substantially same or similar configurations will be omitted.

Referring to FIG. 9, the display device of some embodiments may further include a third organic insulating layer 330 located on the non-display area NDA of the substrate 100. The third organic insulating layer 330 may be located on the second organic insulating layer 320. The third organic insulating layer 330 may include substantially the same material as the pixel defining layer 230, and may be located on the same layer as the pixel defining layer 230. The third organic insulating layer 330 may be physically separated from the pixel defining layer 230. In other words, the pixel defining layer 230 located in the display area DA, and the third organic insulating layer 330 located in the non-display area NDA, might not be connected to each other.

Figure 10:
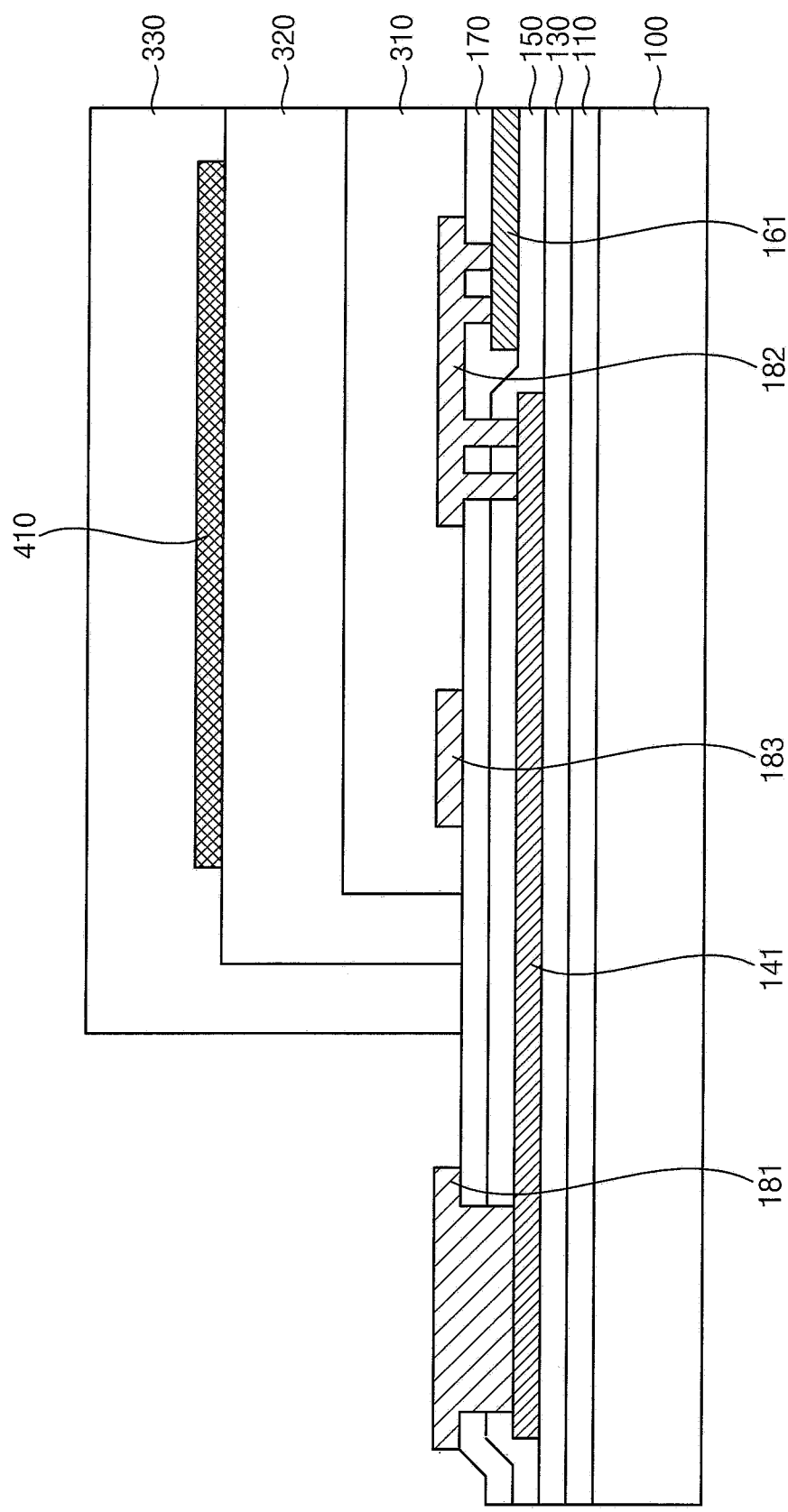
FIG. 10 is a sectional view showing a non-display area of the display device according to some embodiments of the present disclosure.

FIG. 10 is a sectional view showing the non-display area of the display device according to some embodiments of the present disclosure.

The display device described with reference to FIG. 10 may be the same as, or similar to, the display device described with reference to FIG. 9, except for a position of the first upper wiring 410. Accordingly, repeated descriptions for the substantially same or similar configurations will be omitted.

Referring to FIG. 10, the first upper wiring 410 may be located between the second organic insulating layer 320 and the third organic insulating layer 330. The first upper wiring 410 may overlap the contact bridge 182 and the electrostatic electrode 183. The first upper wiring 410 may include substantially the same material as the pixel electrode 220, and may be located on the same layer as the pixel electrode 220.

Figure 11:
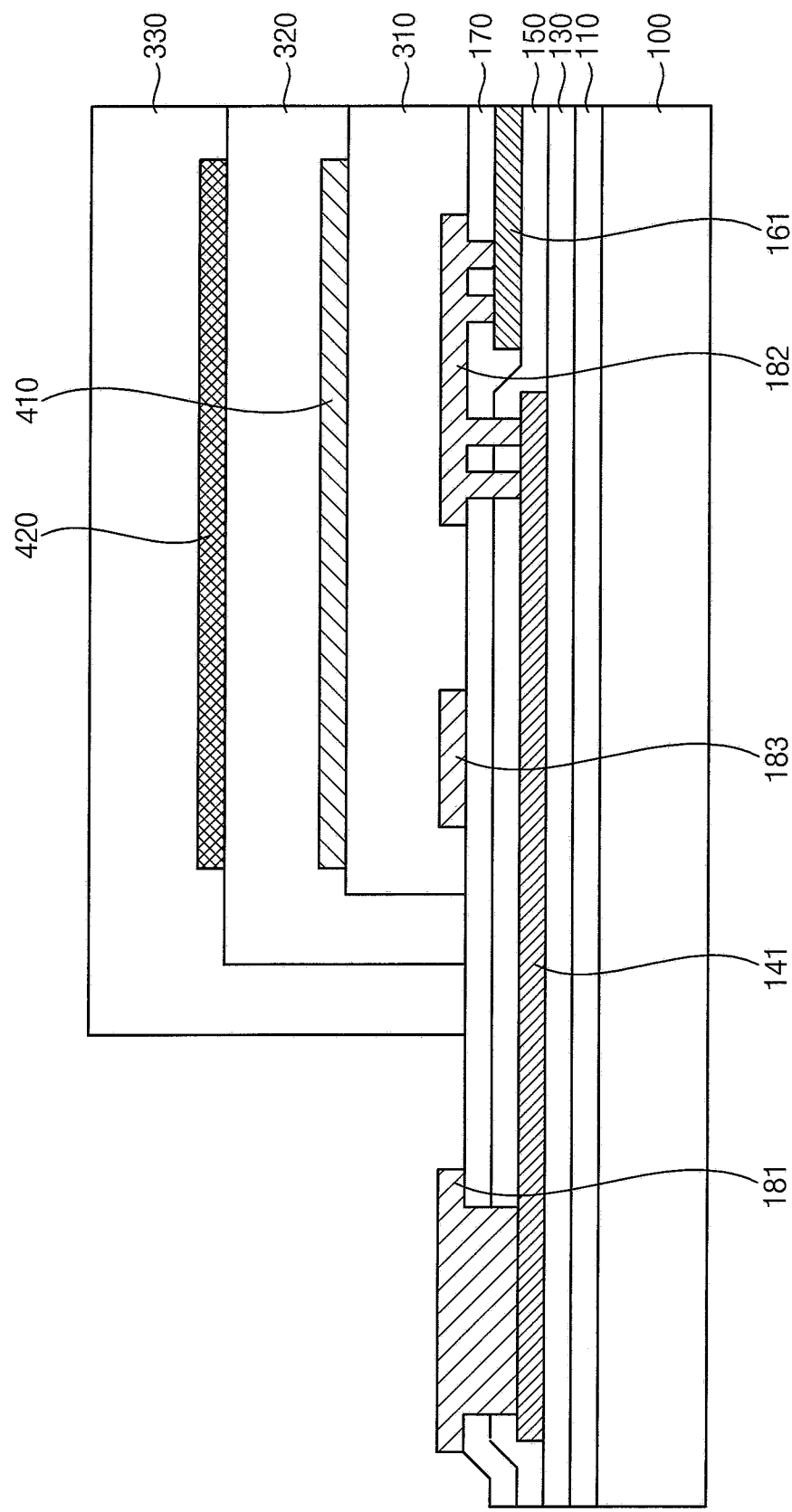
FIG. 11 is a sectional view showing a non-display area of the display device according to some embodiments of the present disclosure.

FIG. 11 is a sectional view showing the non-display area of the display device according to some embodiments of the present disclosure.

The display device described with reference to FIG. 11 may be the same as, or similar to, the display device described with reference to FIG. 9, except for adding a second upper wiring 420. Accordingly, repeated descriptions for the substantially same or similar configurations will be omitted.

Referring to FIG. 11, the display device of some embodiments may further include a second upper wiring 420 located on the non-display area NDA of the substrate 100. The second upper wiring 420 may be located between the second organic insulating layer 320 and the third organic insulating layer 330. The second upper wiring 420 may overlap the first upper wiring 410. The second upper wiring 420 may include substantially the same material as the pixel electrode 220, and may be located on the same layer as the pixel electrode 220.

Figure 12:
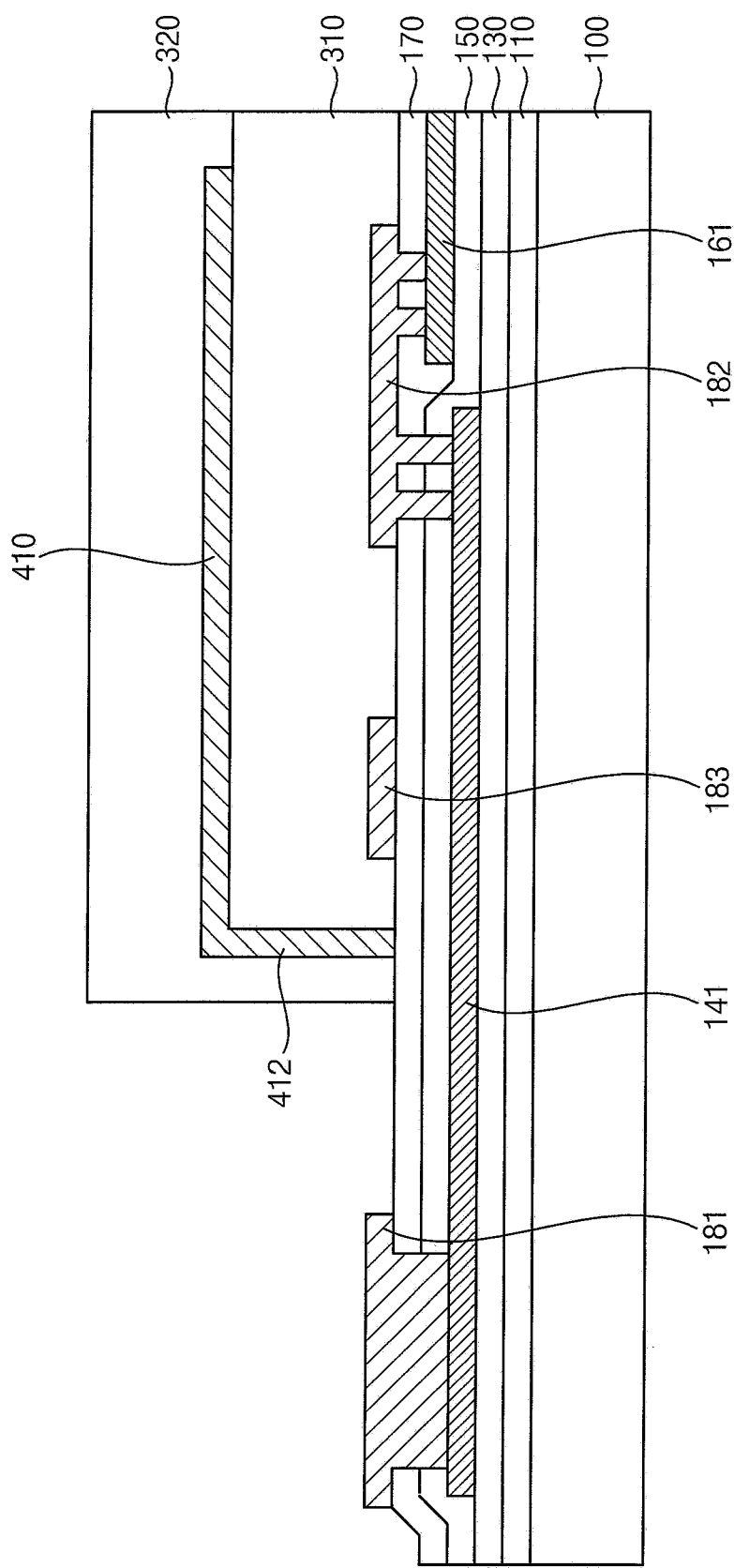
FIG. 12 is a sectional view showing a non-display area of the display device according to some embodiments of the present disclosure.

FIG. 12 is a sectional view showing the non-display area of the display device according to some embodiments of the present disclosure.

The display device described with reference to FIG. 12 may be the same as, or similar to, the display device described with reference to FIGS. 7 and 8, except for the first upper wiring 410. Accordingly, repeated descriptions for the substantially same or similar configurations will be omitted.

Referring to FIG. 12, in some embodiments, the first upper wiring 410 may include a side-wall 412 extending between the pad 181 and the electrostatic electrode 183, and coming into contact with the interlayer insulating layer 170. The side-wall 412 may be interposed between a side portion of the first organic insulating layer 310 and a side portion of the second organic insulating layer 320 to separate them from each other. When the first upper wiring 410 includes the side-wall 412 extending between the pad 181 and the electrostatic electrode 183, influence on the first organic insulating layer 310 otherwise exerted due to damage to the second organic insulating layer 320 may be reduced or prevented, even when the second organic insulating layer 320 is damaged in the process of manufacturing the display device.

Figure 13:
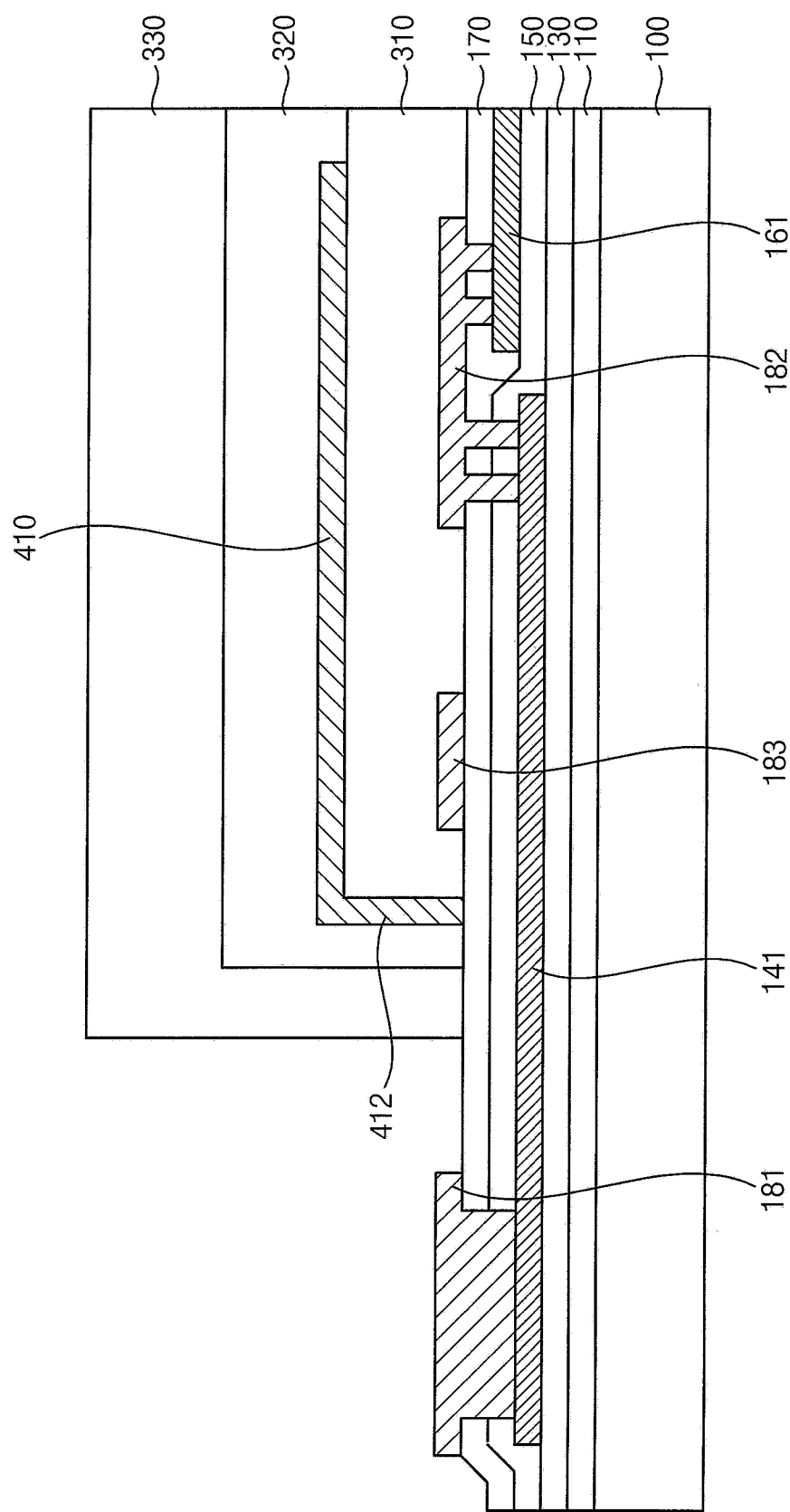
FIG. 13 is a sectional view showing a non-display area of the display device according to some embodiments of the present disclosure.

FIG. 13 is a sectional view showing the non-display area of the display device according to some embodiments of the present disclosure.

The display device described with reference to FIG. 13 may be the same as, or similar to, the display device described with reference to FIG. 9, except for the first upper wiring 410. Accordingly, repeated descriptions for the substantially same or similar configurations will be omitted.

Referring to FIG. 13, in some embodiments, the first upper wiring 410 may include a side-wall 412 extending between the pad 181 and the electrostatic electrode 183, and coming into contact with the interlayer insulating layer 170. The side-wall 412 may be interposed between a side portion of the first organic insulating layer 310 and a side portion of the second organic insulating layer 320 to separate them from each other. When the first upper wiring 410 includes the side-wall 412 extending between the pad 181 and the electrostatic electrode 183, damage to the second and/or third organic insulating layers 320 and 330 might not influence the first organic insulating layer 310, even when the second and/or third organic insulating layers 320 and 330 are damaged in the process of manufacturing the display device.

Figure 14:
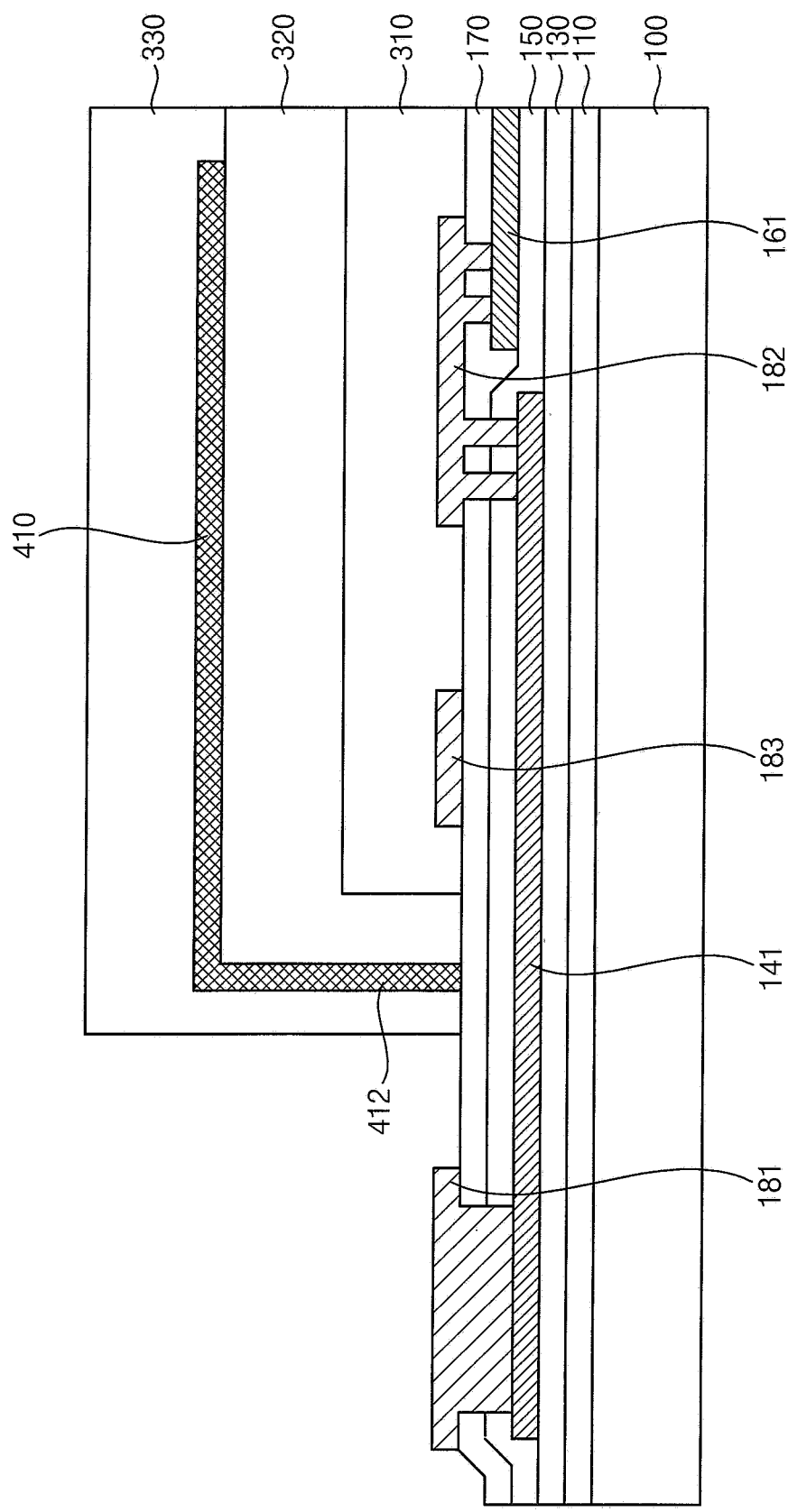
FIG. 14 is a sectional view showing a non-display area of the display device according to some embodiments of the present disclosure.

FIG. 14 is a sectional view showing the non-display area of the display device according to some embodiments of the present disclosure.

The display device described with reference to FIG. 14 may be the same as, or similar to, the display device described with reference to FIG. 10, except for the first upper wiring 410. Accordingly, repeated descriptions for the substantially same or similar configurations will be omitted.

Referring to FIG. 14, in some embodiments, the first upper wiring 410 may include a side-wall 412 extending between the pad 181 and the electrostatic electrode 183, and coming into contact with the interlayer insulating layer 170. The side-wall 412 may be interposed between a side portion of the second organic insulating layer 320 and a side portion of the third organic insulating layer 330 to separate them from each other. When the first upper wiring 410 includes the side-wall 412 extending between the pad 181 and the electrostatic electrode 183, exertion of influence due to damage to the third organic insulating layer 330 may be reduced or prevented with respect to the first and second organic insulating layers 310 and/or 320, even when the third organic insulating layer 330 is damaged in the process of manufacturing the display device.

Figure 15:
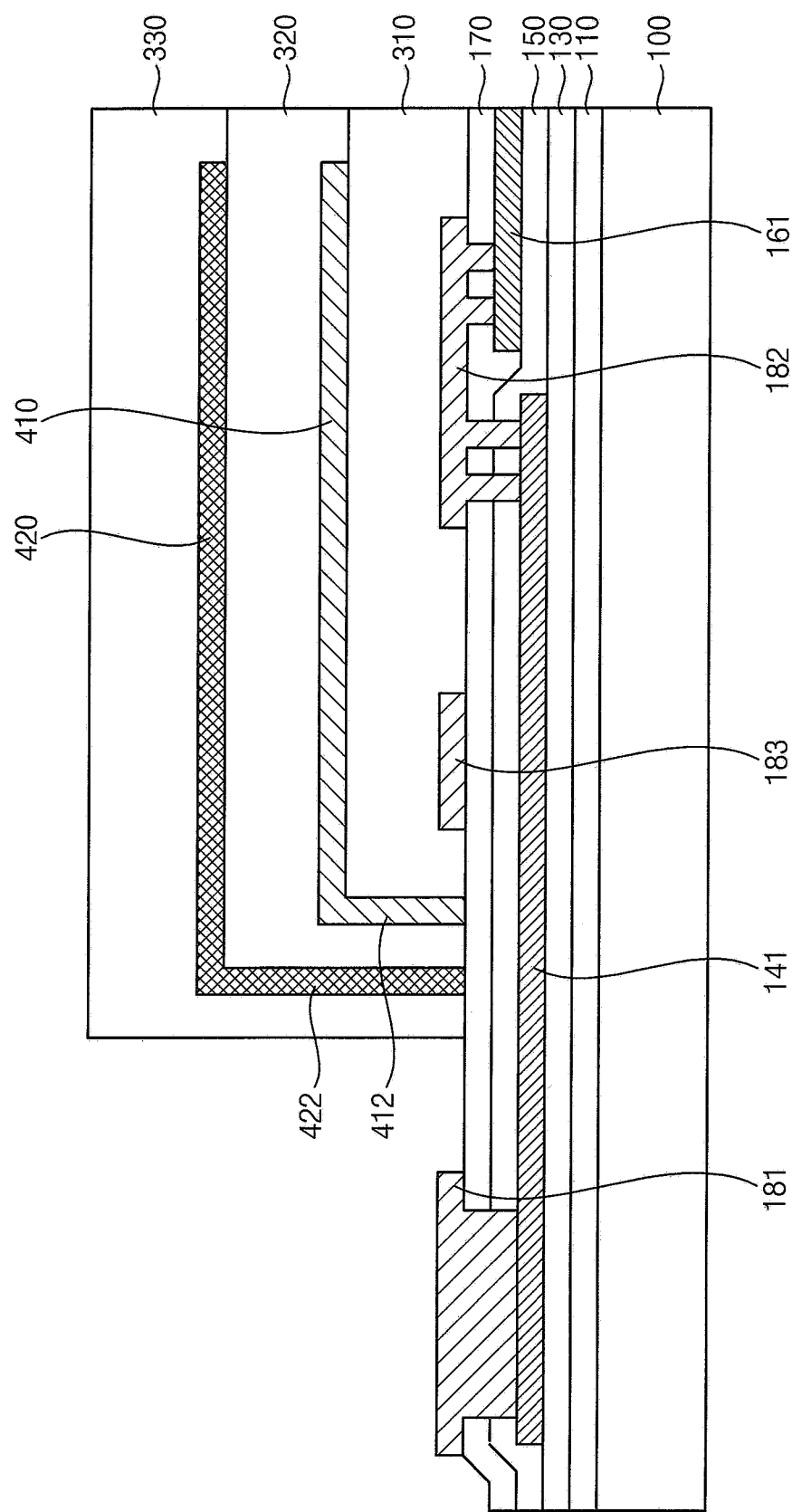
FIG. 15 is a sectional view showing a non-display area of the display device according to some embodiments of the present disclosure.

FIG. 15 is a sectional view showing the non-display area of the display device according to some embodiments of the present disclosure.

The display device described with reference to FIG. 15 may be the same as, or similar to, the display device described with reference to FIG. 11, except for the first upper wiring 410 and the second upper wiring 420. Accordingly, repeated descriptions for the substantially same or similar configurations will be omitted.

Referring to FIG. 15, in some embodiments, the first upper wiring 410 may include a first side-wall 412 extending between the pad 181 and the electrostatic electrode 183, and coming into contact with the interlayer insulating layer 170, while the second upper wiring 420 may include a second side-wall 422 extending between the pad 181 and the electrostatic electrode 183, and coming into contact with the interlayer insulating layer 170. The first side-wall 412 may be interposed between a side portion of the first organic insulating layer 310 and a side portion of the second organic insulating layer 320 to separate them from each other, while the second side-wall 422 may be interposed between a side portion of the second organic insulating layer 320 and a side portion of the third organic insulating layer 330 to separate them from each other. When the first upper wiring 410 and the second upper wiring 420 include the first side-wall 412 and the second side-wall 422, respectively, extending between the pad 181 and the electrostatic electrode 183, exertion of an influence on the first organic insulating layer 310 due to damage to the third organic insulating layer 330 may be reduced or prevented, even when the third organic insulating layer 330 is damaged in the process of manufacturing the display device.

Figure 16:
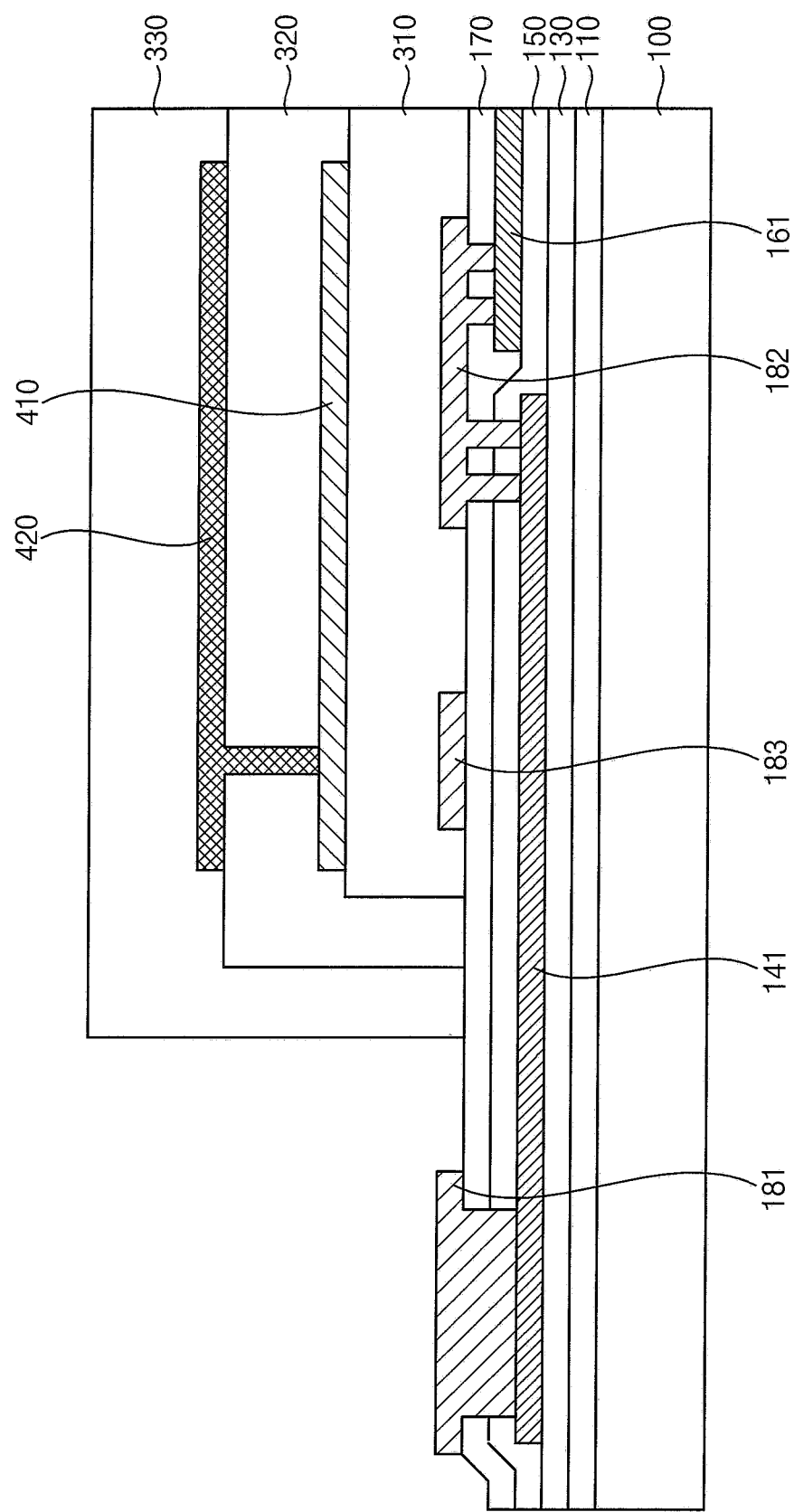
FIG. 16 is a sectional view showing a non-display area of the display device according to some embodiments of the present disclosure.

FIG. 16 is a sectional view showing the non-display area of the display device according to some embodiments of the present disclosure.

The display device described with reference to FIG. 16 may be the same as, or similar to, the display device described with reference to FIG. 11, except for the second upper wiring 420. Accordingly, repeated descriptions for the substantially same or similar configurations will be omitted.

Referring to FIG. 16, the second upper wiring 420 may be connected to the first upper wiring 410. The second upper wiring 420 may come into contact with the first upper wiring 410 through at least one contact hole formed in the second organic insulating layer 320. Because a static electricity inflow path may be provided when the first upper wiring 410 or the second upper wiring 420 is electrically floating, the first upper wiring 410 and the second upper wiring 420 may be connected to each other, and at least one of the first upper wiring 410 and the second upper wiring 420 may be electrically connected to another conductive layer to which a voltage is applied. Accordingly, the first upper wiring 410 and the second upper wiring 420 might not provide the static electricity inflow path.

Figure 17:
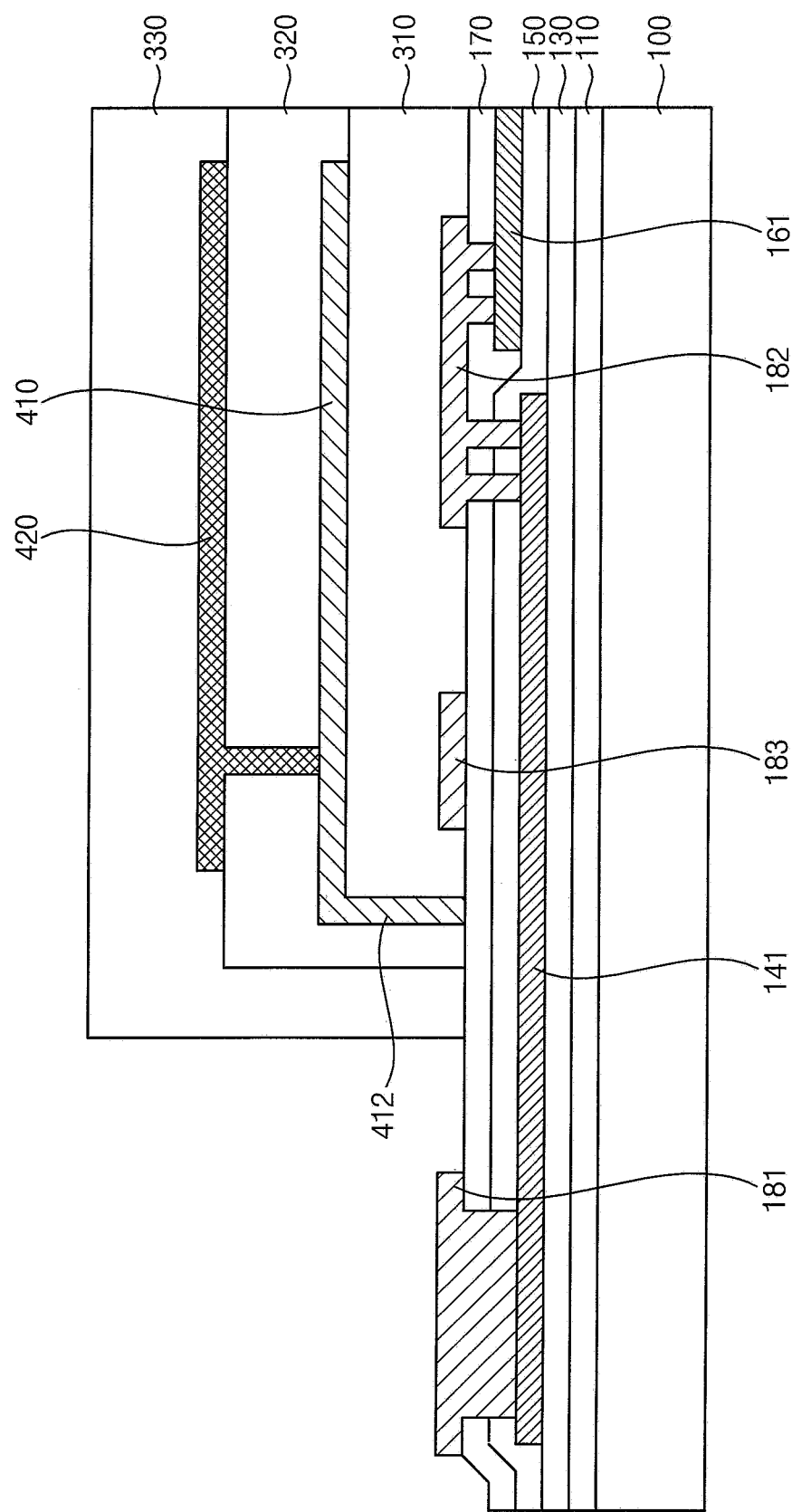
FIG. 17 is a sectional view showing a non-display area of the display device according to some embodiments of the present disclosure.

FIG. 17 is a sectional view showing the non-display area of the display device according to some embodiments of the present disclosure.

The display device described with reference to FIG. 17 may be the same as, or similar to, the display device described with reference to FIG. 16, except for the first upper wiring 410. Accordingly, repeated descriptions for the substantially same or similar configurations will be omitted.

Referring to FIG. 17, in some embodiments, the first upper wiring 410 may include a side-wall 412 extending between the pad 181 and the electrostatic electrode 183, and coming into contact with the interlayer insulating layer 170. The side-wall 412 may be interposed between a side portion of the first organic insulating layer 310 and a side portion of the second organic insulating layer 320 to separate them from each other.

Figure 18:
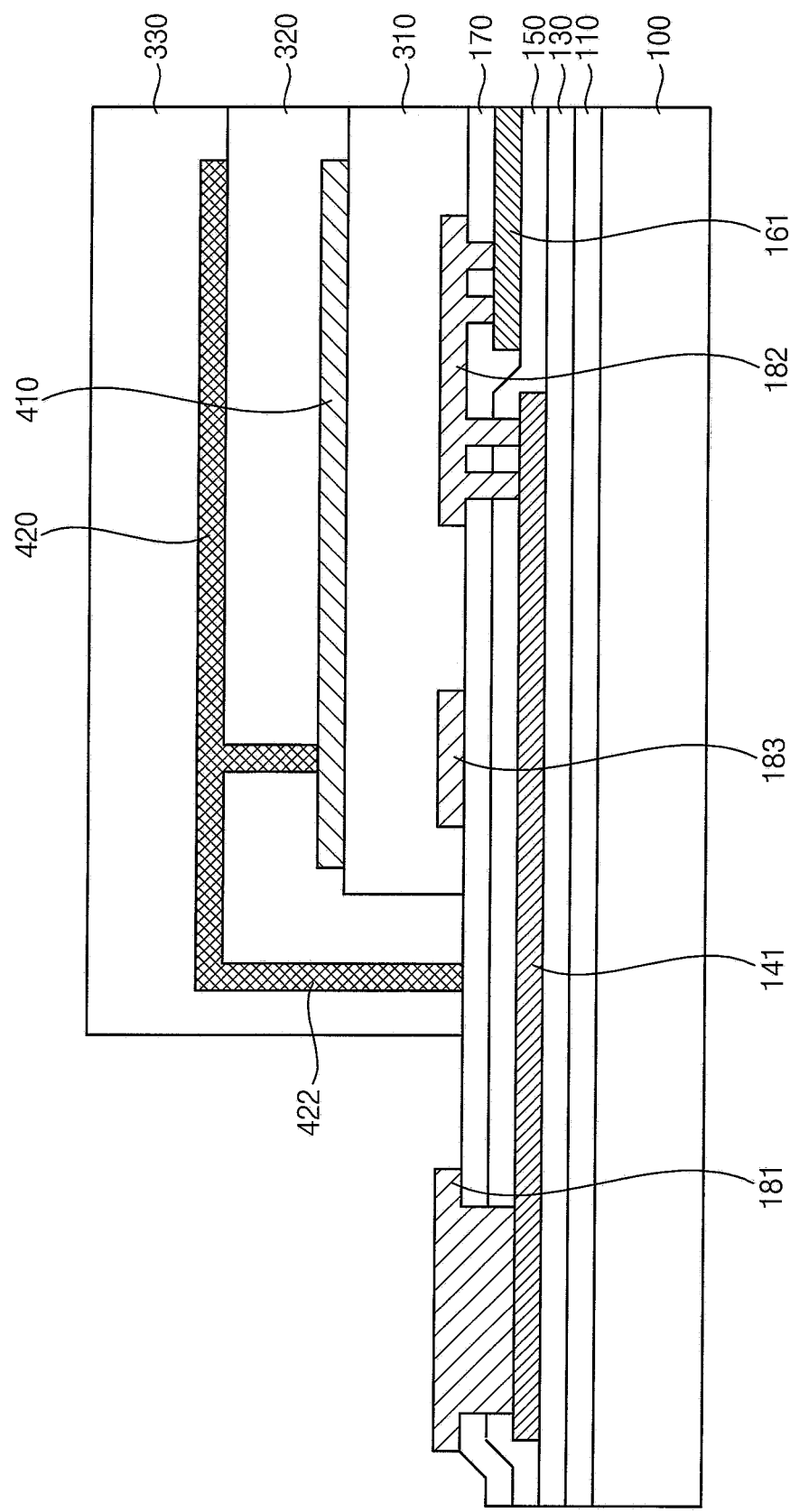
FIG. 18 is a sectional view showing a non-display area of the display device according to some embodiments of the present disclosure.

FIG. 18 is a sectional view showing the non-display area of the display device according to some embodiments of the present disclosure.

The display device described with reference to FIG. 18 may be the same as, or similar to, the display device described with reference to FIG. 16, except for the second upper wiring 420. Accordingly, repeated descriptions for the substantially same or similar configurations will be omitted.

Referring to FIG. 18, in some embodiments, the second upper wiring 420 may include a side-wall 422 extending between the pad 181 and the electrostatic electrode 183, and coming into contact with the interlayer insulating layer 170. The side-wall 422 may be interposed between a side portion of the second organic insulating layer 320 and a side portion of the third organic insulating layer 330 to separate them from each other.

Figure 19:
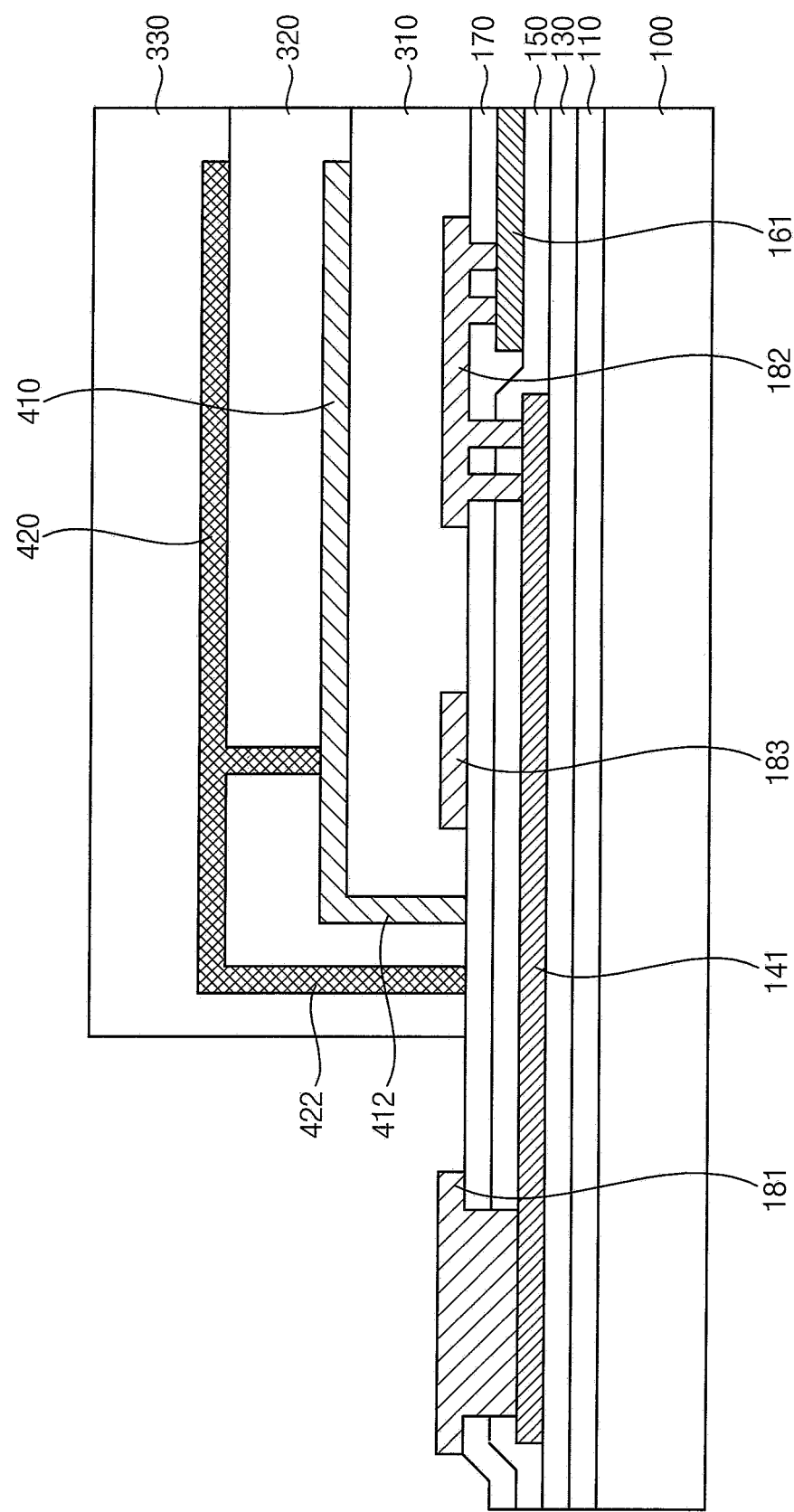
FIG. 19 is a sectional view showing a non-display area of the display device according to some embodiments of the present disclosure.

FIG. 19 is a sectional view showing the non-display area of the display device according to some embodiments of the present disclosure.

The display device described with reference to FIG. 19 may be the same as, or similar to, the display device described with reference to FIG. 16, except for the first upper wiring 410 and the second upper wiring 420. Accordingly, repeated descriptions for the substantially same or similar configurations will be omitted.

Referring to FIG. 19, in some embodiments, the first upper wiring 410 may include a first side-wall 412 extending between the pad 181 and the electrostatic electrode 183, and coming into contact with the interlayer insulating layer 170, while the second upper wiring 420 may include a second side-wall 422 extending between the pad 181 and the electrostatic electrode 183, and coming into contact with the interlayer insulating layer 170. The first side-wall 412 may be interposed between a side portion of the first organic insulating layer 310 and a side portion of the second organic insulating layer 320 to separate them from each other, while the second side-wall 422 may be interposed between a side portion of the second organic insulating layer 320 and a side portion of the third organic insulating layer 330 to separate them from each other.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims, with functional equivalents thereof to be included therein.

What is claimed is:

1. A display device comprising:
    a substrate comprising a display area and a non-display area;
    a first wiring at the non-display area of the substrate;
    a second wiring on a layer that is different from the first wiring at the non-display area of the substrate;
    an inorganic insulating layer on the first wiring and the second wiring;
    a pad on the inorganic insulating layer, and connected to a first end of the first wiring;
    a contact bridge on the inorganic insulating layer, and connecting the second wiring to a second end of the first wiring;
    an electrostatic electrode on the inorganic insulating layer between the pad and the contact bridge;
    a first organic insulating layer covering the contact bridge and the electrostatic electrode, and exposing the pad;
    a first upper wiring on the first organic insulating layer, and overlapping the contact bridge and the electrostatic electrode; and
    a second organic insulating layer on the first upper wiring.

2. The display device of claim 1, wherein a distance from the pad to the contact bridge is greater than a distance from the pad to the electrostatic electrode.

3. The display device of claim 1, wherein the first upper wiring comprises at least one of molybdenum (Mo), aluminum (Al), neodymium (Nd), nickel (Ni), lanthanum (La), titanium (Ti), copper (Cu), silver (Ag), indium tin oxide (ITO), or indium zinc oxide (IZO).

4. The display device of claim 1, wherein the first upper wiring comprises a side-wall extending between the pad and the electrostatic electrode, and coming into contact with the inorganic insulating layer.

5. The display device of claim 1, further comprising:
    an active pattern on the display area of the substrate;
    a first gate electrode on the active pattern;
    a second gate electrode on the first gate electrode;
    a source electrode and a drain electrode connected to the active pattern;
    a first via insulating layer on the source electrode and the drain electrode;
    a pixel electrode on the first via insulating layer, and electrically connected to the drain electrode; and
    a pixel defining layer on a portion of the pixel electrode.

6. The display device of claim 5, wherein the first organic insulating layer, the first upper wiring, and the second organic insulating layer are on the same layers as the first via insulating layer, the pixel electrode, and the pixel defining layer, respectively.

7. The display device of claim 5, further comprising:
a second via insulating layer between the first via insulating layer and the pixel defining layer; and
a connection electrode between the first via insulating layer and the second via insulating layer, and connecting the drain electrode to the pixel electrode.

8. The display device of claim 7, wherein the first organic insulating layer, the first upper wiring, and the second organic insulating layer are on the same layers as the first via insulating layer, the connection electrode, and the second via insulating layer, respectively.

9. The display device of claim 7, wherein the first organic insulating layer, the first upper wiring, and the second organic insulating layer are on the same layers as the first and second via insulating layers, the pixel electrode, and the pixel defining layer, respectively.

10. The display device of claim 5, further comprising an electrostatic active pattern connected to the electrostatic electrode, and on a same layer as the active pattern,
wherein the electrostatic active pattern, the first wiring, and the electrostatic electrode form an electrostatic diode.

11. The display device of claim 1, further comprising a third organic insulating layer on the second organic insulating layer.

12. The display device of claim 11, further comprising a second upper wiring between the second organic insulating layer and the third organic insulating layer, and overlapping the first upper wiring.

13. The display device of claim 12, wherein the second upper wiring comprises at least one of molybdenum (Mo), aluminum (Al), neodymium (Nd), nickel (Ni), lanthanum (La), titanium (Ti), copper (Cu), silver (Ag), indium tin oxide (ITO), or indium zinc oxide (IZO).

14. The display device of claim 12, wherein the second upper wiring comprises a side-wall extending between the pad and the electrostatic electrode, and coming into contact with the inorganic insulating layer.

15. The display device of claim 12, wherein the second upper wiring is connected to the first upper wiring.

16. The display device of claim 12, further comprising:
an active pattern on the display area of the substrate;
a first gate electrode on the active pattern;
a second gate electrode on the first gate electrode;
a source electrode and a drain electrode connected to the active pattern;
a first via insulating layer on the source electrode and the drain electrode;
a connection electrode on the first via insulating layer, and connected to the drain electrode;
a second via insulating layer on the connection electrode;
a pixel electrode on the second via insulating layer, and connected to the connection electrode; and
a pixel defining layer on a portion of the pixel electrode.

17. The display device of claim 16, wherein the first organic insulating layer, the first upper wiring, the second organic insulating layer, the second upper wiring, and the third organic insulating layer are on the same layers as the first via insulating layer, the connection electrode, the second via insulating layer, the pixel electrode, and the pixel defining layer, respectively.

18. The display device of claim 1, further comprising a driving chip on the pad exposed by the first organic insulating layer, and electrically connected to the pad.

19. A display device comprising:
a substrate;
a first wiring on the substrate;
a second wiring on the substrate on a layer that is different from the first wiring;
an inorganic insulating layer on the first wiring and the second wiring;
a pad on the inorganic insulating layer, and connected to a first end of the first wiring;
a contact bridge on the inorganic insulating layer, and connecting a second end of the first wiring to the second wiring;
an electrostatic electrode on the inorganic insulating layer between the pad and the contact bridge; and
an organic insulating layer covering the contact bridge and the electrostatic electrode, and exposing the pad.

20. The display device of claim 19, wherein a distance from the pad to the contact bridge is greater than a distance from the pad to the electrostatic electrode.

* * * * *